United States Patent
Chen

(10) Patent No.: US 12,300,747 B2
(45) Date of Patent: May 13, 2025

(54) SEMICONDUCTOR DEVICE AND MANUFACTURING METHOD THEREOF

(71) Applicants: TAIWAN SEMICONDUCTOR MANUFACTURING CO., LTD., Hsinchu (TW); TSMC CHINA COMPANY LIMITED, Shanghai (CN)

(72) Inventor: Zheng-Long Chen, New Taipei (TW)

(73) Assignees: TAIWAN SEMICONDUCTOR MANUFACTURING CO., LTD., Hsinchu (TW); TSMC CHINA COMPANY LIMITED, Shanghai (CN)

( * ) Notice: Subject to any disclaimer, the term of this patent is extended or adjusted under 35 U.S.C. 154(b) by 0 days.

(21) Appl. No.: 18/489,633

(22) Filed: Oct. 18, 2023

(65) Prior Publication Data

US 2024/0047575 A1    Feb. 8, 2024

Related U.S. Application Data

(60) Continuation of application No. 17/716,392, filed on Apr. 8, 2022, now Pat. No. 11,824,115, which is a (Continued)

(30) Foreign Application Priority Data

Aug. 21, 2020   (CN) .......................... 202010847981.9

(51) Int. Cl.
*H01L 29/78*   (2006.01)
*H01L 21/225*   (2006.01)
(Continued)

(52) U.S. Cl.
CPC ...... *H01L 29/7816* (2013.01); *H01L 21/2253* (2013.01); *H01L 21/26513* (2013.01); (Continued)

(58) Field of Classification Search
CPC ............ H01L 29/7816; H01L 21/2253; H01L 21/26513; H01L 21/266; H01L 21/324; (Continued)

(56) References Cited

U.S. PATENT DOCUMENTS 6,468,870 B1 *  10/2002  Kao .................. H01L 21/28194
257/E29.256
2014/0167158 A1   6/2014  Pan et al.
(Continued)

FOREIGN PATENT DOCUMENTS

TW        201128774 A      8/2011

*Primary Examiner* — David Vu
(74) *Attorney, Agent, or Firm* — Maschoff Brennan

(57) ABSTRACT

A semiconductor device includes a substrate, a deep well, a doped region, a gate, and source and drain regions. The deep well is of a first conductivity type in the substrate. The doped region is in the deep well with an impurity of a second conductivity type. The field oxide is over the deep well and has a side interfaced with the doped region. The gate is over the field oxide. The source and drain regions are over the substrate and laterally separated at least in part by the doped region and the field oxide.

20 Claims, 16 Drawing Sheets

Related U.S. Application Data division of application No. 17/011,404, filed on Sep. 3, 2020, now Pat. No. 11,302,809.

(51) Int. Cl.
  *H01L 21/265* (2006.01)
  *H01L 21/266* (2006.01)
  *H01L 21/324* (2006.01)
  *H01L 29/06* (2006.01)
  *H01L 29/10* (2006.01)
  *H01L 29/40* (2006.01)
  *H01L 29/66* (2006.01)

(52) U.S. Cl.
  CPC .......... *H01L 21/266* (2013.01); *H01L 21/324* (2013.01); *H01L 29/063* (2013.01); *H01L 29/1095* (2013.01); *H01L 29/408* (2013.01); *H01L 29/66681* (2013.01)

(58) Field of Classification Search
  CPC . H01L 29/063; H01L 29/1095; H01L 29/408; H01L 29/66681; H01L 29/0886; H01L 29/42368; H01L 29/0634; H01L 29/0607; H01L 29/0684; H01L 29/36
  See application file for complete search history.

(56) References Cited

U.S. PATENT DOCUMENTS

| | | |
|---|---|---|
| 2014/0179079 A1 | 6/2014 | Huang et al. |
| 2015/0041891 A1 | 2/2015 | Huang et al. |
| 2018/0350978 A1 | 12/2018 | Kim |
| 2020/0075759 A1 | 3/2020 | Pala |

* cited by examiner

SEMICONDUCTOR DEVICE AND MANUFACTURING METHOD THEREOF

PRIORITY CLAIM AND CROSS-REFERENCE

The present application is a Continuation Application of U.S. application Ser. No. 17/716,392, filed Apr. 8, 2022, which is a Divisional Application of the U.S. application Ser. No. 17/011,404, filed Sep. 3, 2020, now U.S. Pat. No. 11,302,809, issued Apr. 12, 2022, which claims priority to China Application Serial Number 202010847981.9, filed Aug. 21, 2020, all of which are herein incorporated by reference in their entirety.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As semiconductor devices are scaled down, new techniques are desired to maintain the electronic components' performance from one generation to the next. For example, low on-resistance and high breakdown voltage of transistors are desirable for various high power applications.

As semiconductor technologies evolve, metal oxide semiconductor field effect transistors (MOSFET) have been widely used in today's integrated circuits. MOSFETs are voltage controlled devices. When a control voltage is applied to the gate of a MOSFET and the control voltage is greater than the threshold of the MOSFET, a conductive channel is established between the drain and the source of the MOSFET. As a result, a current flows between the drain and the source of the MOSFET. On the other hand, when the control voltage is less than the threshold of the MOSFET, the MOSFET is turned off accordingly.

According to the conductivity type difference, MOSFETs may include two major categories. One is n-channel MOSFETs; the other is p-channel MOSFETs. On the other hand, according to the structure difference, MOSFETs can be further divided into three sub-categories, planar MOSFETs, lateral diffused MOS (LDMOS) FETs and vertical diffused MOSFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
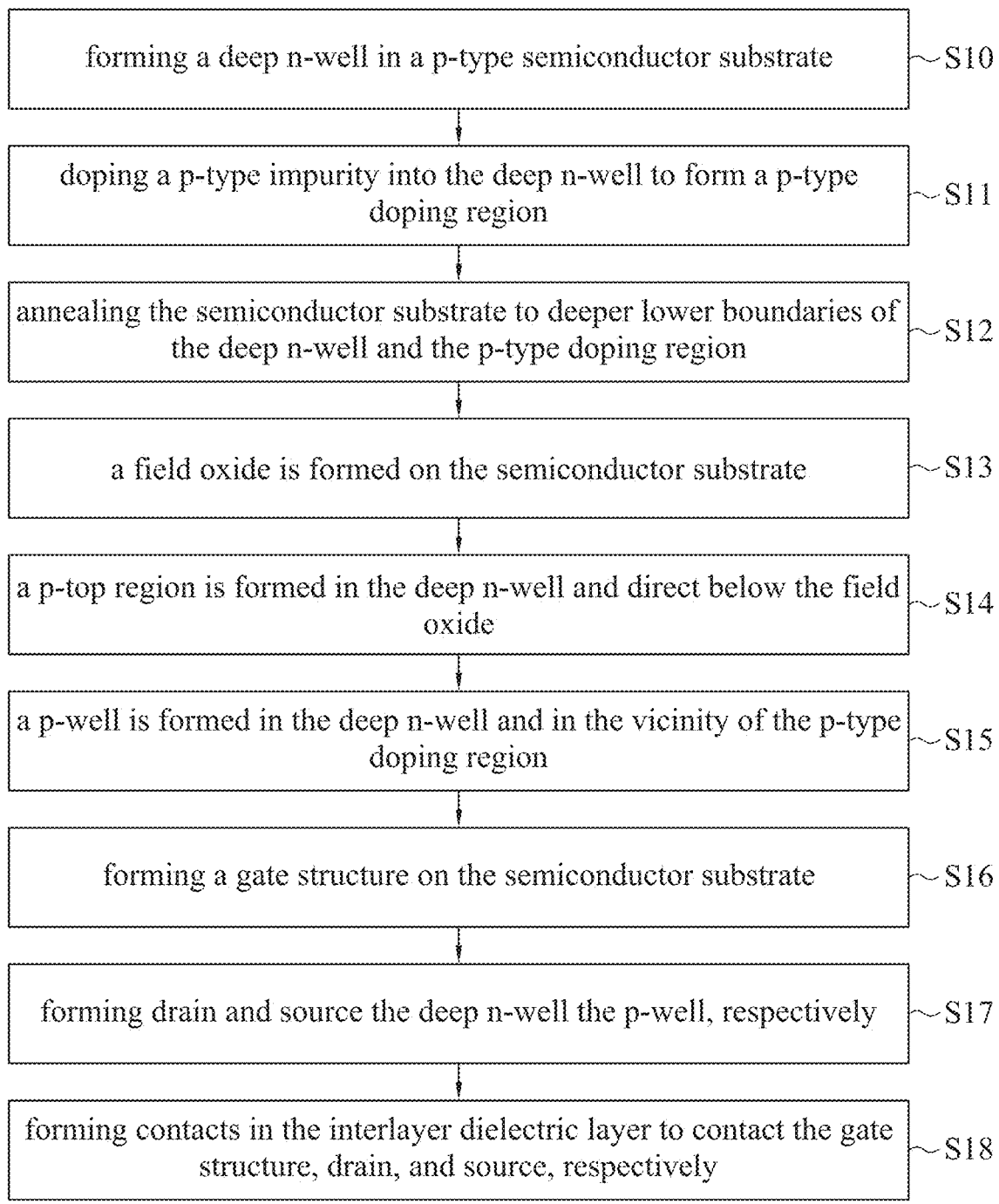
FIG. 1 illustrates a block diagram of a method of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

The lateral diffused (LD) MOS transistor has advantages. For example, the LDMOS transistor is capable of delivering more current per unit area because its asymmetric structure provides a short channel between the drain and the source of the LDMOS transistor. However, it has been appreciated that the LDMOS transistor suffers some issues as described below. A breakdown voltage of the LDMOS transistor formed with a field oxide (FOX) is limited by an electric field peak which may take place in the vicinity of a bird's beak of the FOX that may lead to a device breakdown failure. By way of example, the device breakdown failure may occur when a deep n-well (DNW) has not been fully depleted through a p-type semiconductor substrate since a concentration of an n-type dopant is higher than a concentration of a p-type dopant near the bird's beak of the FOX, which in turn adversely affects the electric field. When the concentration of DNW is lowered to reach a charge balance near the bird's beak, the peak electric field may be improved. However, it will cause breakdown in the drift region and reduce the breakdown voltage of the LDMOS transistor.

The present disclosure will be described with respect to embodiments in a specific context, a LDMOS transistor manufactured using an improved process flow to address the foregoing issues resulting from the FOX. In some embodiments, the LDMOS transistor may be an ultra-high voltage LDMOS transistor. The embodiments of the disclosure may also be applied, however, to a variety of metal oxide semiconductor transistors. Hereinafter, various embodiments will be explained in detail with reference to the accompanying drawings.

Referring now to FIG. 1, illustrated is an exemplary method M1 for fabrication of a semiconductor device in accordance with some embodiments, in which the fabrication includes a process of a semiconductor device with an additional p-type doped region that is interfaced with a bird's beak of a field oxide below a gate structure thereof. The method M1 includes a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable. The method M1 includes fabrication of a semiconductor device 100. However, the fabrication of the semiconductor device 100 is merely example for describing the semiconductor device 100 with an additional p-type doped region that is interfaced with a bird's beak of a field oxide below a gate structure with some embodiments of the present disclosure.

It is noted that FIG. 1 has been simplified for a better understanding of the disclosed embodiment. Moreover, the semiconductor device 100 may be configured as a system-on-chip (SoC) device having various PMOS and NMOS transistors that are fabricated to operate at different voltage levels. The PMOS and NMOS transistors may provide low voltage functionality including logic/memory devices and input/output devices, and high voltage functionality including power management devices. For example, transistors that provide low voltage functionality may have operating (or drain) voltages of about 1.1 V with standard CMOS technology, or voltages of about 1.8/2.5/3.3 V with special (input/output) transistors in standard CMOS technology, and other voltages are within the scope of the disclosure. In addition, transistors that provide medium/high voltage functionality may have operating (or drain) voltages of about 5 V or greater (e.g., about 20-35 V), and other voltages are within the scope of the disclosure. It is understood that the semiconductor device 100 in FIGS. 2-10 may also include resistors, capacitors, inductors, diodes, and other suitable microelectronic devices that may be implemented in integrated circuits.

Figure 2:
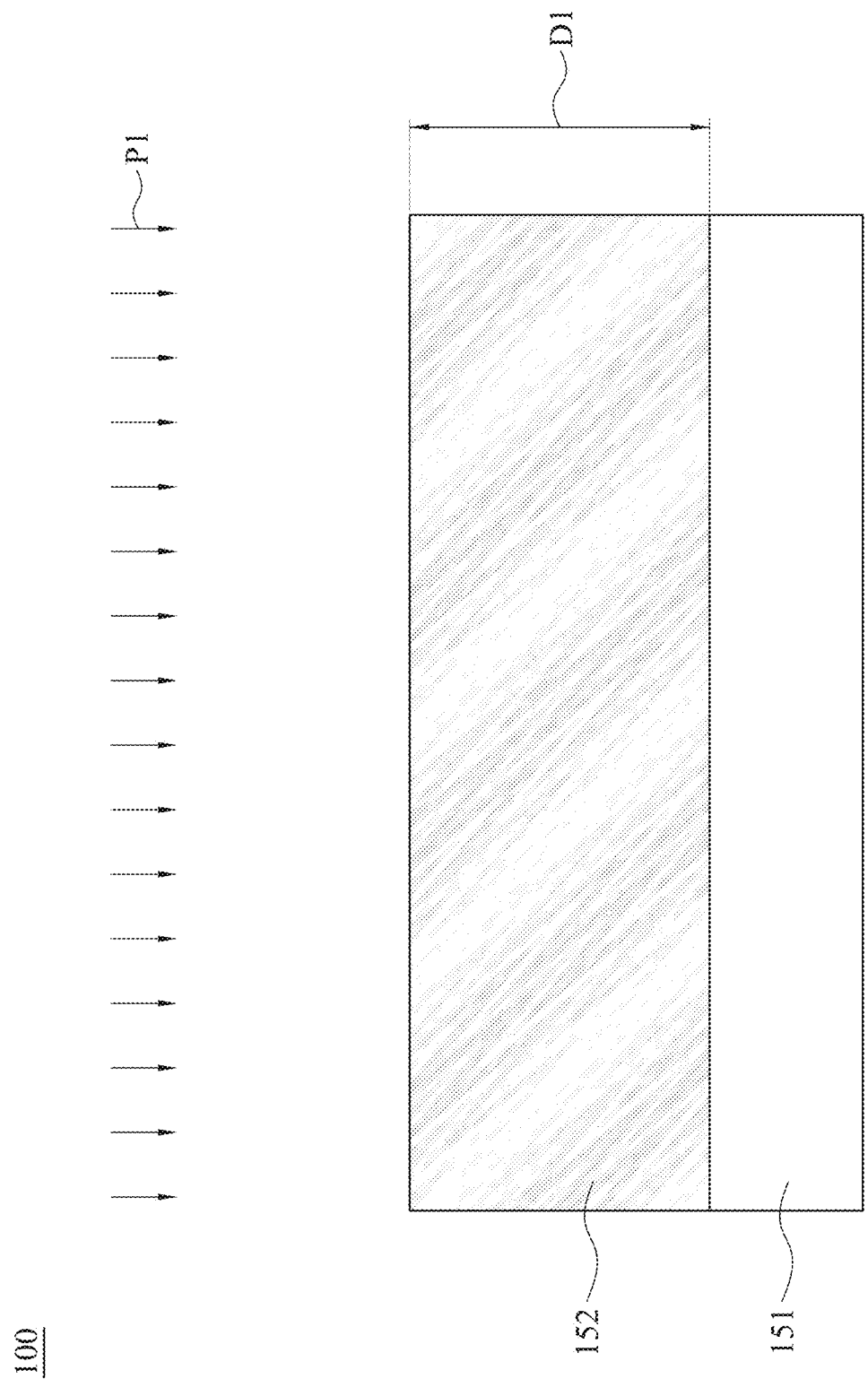
FIGS. 2 to 10 illustrate a method for manufacturing a semiconductor device in different stages in accordance with some embodiments.

FIGS. 2 to 10 illustrate a method for manufacturing the semiconductor device 100 in different stages in accordance with some embodiments. The method M1 begins at block S10 where a deep n-well is formed in a p-type semiconductor substrate, as illustrated in FIG. 2. The semiconductor substrate 151 may include a semiconductor wafer such as a silicon wafer. Alternatively, the semiconductor substrate 151 may include other elementary semiconductors such as germanium. The semiconductor substrate 151 may also include a compound semiconductor such as silicon carbide, gallium arsenic, indium arsenide, and indium phosphide. Moreover, the semiconductor substrate 151 may include an alloy semiconductor such as silicon germanium, silicon germanium carbide, gallium arsenic phosphide, and gallium indium phosphide. In some embodiments, the semiconductor substrate 151 includes an epitaxial layer (epi layer) overlying a bulk semiconductor. Furthermore, the semiconductor substrate 151 may include a semiconductor-on-insulator (SOI) structure. For example, the semiconductor substrate 151 may include a buried oxide (BOX) layer formed by a process such as separation by implanted oxygen (SIMOX). In various embodiments, the semiconductor substrate 151 may include a buried layer such as an n-type buried layer (NBL), a p-type buried layer (PBL), and/or a buried dielectric layer including a buried oxide (BOX) layer.

In some embodiments, illustrated as an n-type MOS, the semiconductor substrate 151 includes a p-type silicon substrate (p-substrate). For example, p-type impurities (e.g., boron) are doped into the semiconductor substrate 151 to form the p-substrate. To form a complementary MOS, an n-type buried layer, i.e., deep n-well (DNW) 152 (may be also referred to as an n-drift region), may be implanted deeply under the active region of the semiconductor substrate 151. In some embodiments, The DNW 152 is formed by an ion implantation process P1. A patterned photoresist layer (not illustrated) may be formed over the semiconductor substrate 151 as a mask during the implantation process. By way of example and not limitation, the DNW 152 may be formed by an implantation process having a dose that may be in a range from about $1.0 \times 10^{11}$ atoms/centimeter$^3$ to about $1.0 \times 10^{13}$ atoms/centimeter$^3$, and other dose ranges are within the scope of the disclosure. In some embodiments, the DNW 152 has a dopant concentration that may be greater than $1.0 \times 10^{13}$ atoms/centimeter$^3$, and other dopant concentrations are within the scope of the disclosure. By way of example and not limitation, the DNW 152 has a dopant concentration that is in a range from about $1.0 \times 10^{13}$ atoms/centimeter$^3$ to about $1.0 \times 10^{16}$ atoms/centimeter$^3$, and other dopant concentration ranges are within the scope of the disclosure. In some embodiments, arsenic or phosphorus ions may be implanted to form the DNW 152. In some embodiments, the DNW 152 is formed by selective diffusion. The DNW 152 functions to electrically isolate the semiconductor substrate 151.

Figure 3:
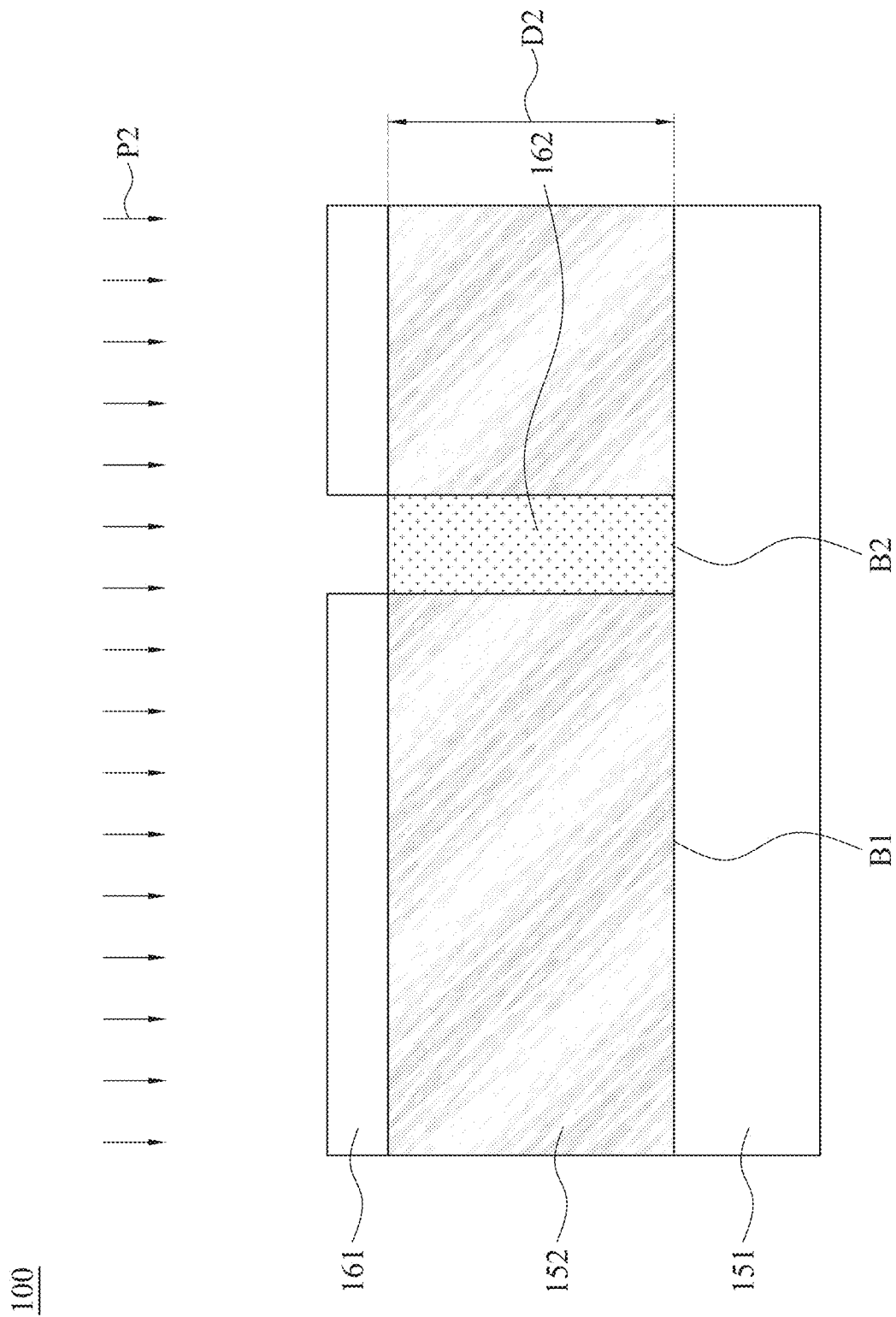

Returning to FIG. 1, the method M1 then proceeds to block S11 where a p-type impurity is doped into the deep n-well to form a p-type doped region. With reference to FIG. 3, in some embodiments of block S11, a photoresist 161 is coated on the DNW 152. The photoresist 161 is patterned using lithography techniques with the desired pattern for a p-type doped region 162, which will be formed in the DNW 152. The photoresist 161 is developed to expose the DNW 152 over the semiconductor substrate 151. Then, a high energy p-type dopant implantation process P2 is then performed in order to form the p-type doped region 162 through the photoresist 161.

Figure 5:
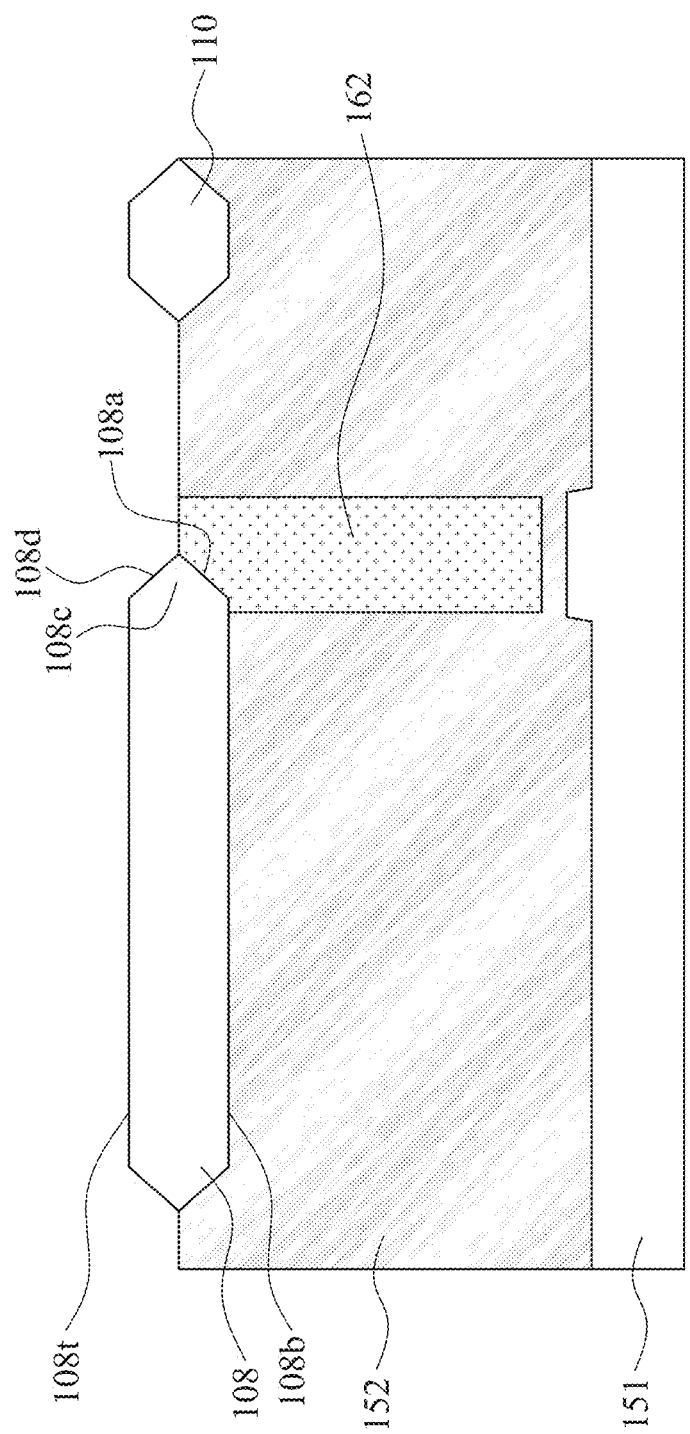

In some embodiments, a breakdown voltage of the semiconductor device 100 is limited by an electric field peak which may take place in the vicinity of a bird's beak of (may be also referred to as a tip corner) the FOX 108 shown in FIG. 5, and the electric field peak may lead to a device breakdown failure. By way of example, the device breakdown failure may occur when the DNW 152 has not been fully depleted through the semiconductor substrate 151 since a dopant concentration of n-type may be higher than a dopant concentration of p-type to some extent near the bird's beak of the FOX 108, which in turn adversely affects the electric field. When the concentration of DNW 152 is lowered to reach a charge balance near the bird's beak 108c of the FOX 108 shown in FIG. 5, the peak electric field may be improved. However, it will cause breakdown in the DNW 152 and reduce the breakdown voltage of the semiconductor device 100.

Therefore, a p-type dopant is implant into the p-type doped region 162 (i.e., the vicinity of the bird's beak 108c of the FOX 108 near the source region shown in FIG. 5) in the DNW 152, such that a dopant concentration of p-type near the source region is increased, and thus a charge balance is reached. Therefore, the electric field peak may be reduced, thereby achieving an improved breakdown voltage for the semiconductor device 100. For example, if the concentration of the p-type doped region 162 is increased so that the concentration of the n-type dopant in the DNW 152 is less than about 10 times the concentration of the p-type dopant in the p-type doped region 162, then the electric field near the source region of the semiconductor device 100 may be lower than about $1.5 \times 10^5$ Vcm$^{-1}$, such that a charge balance may be reached. Thus, a breakdown voltage for the semiconductor device 100 may improve by about 100 V. It is noted that other electric field strengths and/or breakdown voltages are within the scope of the disclosure.

In some embodiments, a dopant concentration of p-type is lower than a dopant concentration of n-type in the p-type doped region 162. In some embodiments, a dopant concentration of p-type in the p-type doped region 162 is lower than a dopant concentration of n-type in the DNW 152. By way of example and not limitation, a concentration of the p-type dopant in the p-type doped region 162 is lower than a concentration of an n-type dopant in the DNW 152. In some embodiments, a concentration of the p-type dopant in the p-type doped region 162 is at the same order of magnitude as a concentration of the n-type dopant in the DNW 152. That is, the concentration of the n-type dopant in the DNW 152 is greater than the concentration of the p-type dopant in the p-type doped region 162 and lower than about ten times the concentration of the p-type dopant in the p-type doped region 162. In other words, a difference between the concentration of the p-type dopant in the p-type doped region 162 and a concentration of the n-type dopant in the DNW 152 is less than about an order of magnitude.

By way of example and not limitation, a concentration of the n-type dopant in the DNW 152 may be about $8.58 \times 10^{15}$ atoms/centimeter$^3$ and a concentration of the p-type dopant in the p-type doped region 162 may be about $1.4 \times 10^{15}$ atoms/centimeter$^3$ which is at the same order of magnitude (i.e., $10^{15}$) as the concentration of the n-type dopant in the DNW 152, and other concentrations are within the scope of the disclosure. In some embodiments, a difference between a concentration of the p-type dopant in the p-type doped region 162 and a concentration of the n-type dopant in the DNW 152 may be less than an order of magnitude to reach a charge balance near the source region, thereby achieving an improved breakdown voltage for the semiconductor device 100. If the difference between the concentration of the p-type dopant in the p-type doped region 162 and the concentration of the n-type dopant in the DNW 152 is greater than an order of magnitude, it may in turn adversely affect the breakdown voltage. In some embodiments, the dopant may include boron (B), and may include a dose of an order of $1.0 \times 10^{12}$ atoms/centimeter$^3$ to $1.0 \times 10^{15}$ atoms/centimeter$^3$ dopant concentration at about 300 keV for the implantation process P2, and other doses are within the scope of the disclosure. If the concentration is low, the charge balance cannot be effectively reached, which in turn might lead to breakdown voltage degradation.

In some embodiments, the p-type doped region 162 extends from a top surface of the semiconductor substrate 151 a distance (D2) into the semiconductor substrate 151. A depth D2 of the p-type doped region 162 includes the entire thickness (or depth) D1 of the DNW 152. In some embodiments, the depth D2 of the p-type doped region 162 may be in a range from about 0.1 μm to about 10 μm, by way of example and not limitation, to reach a charge balance near the source region. If the depth D2 of the p-type doped region 162 is less than about 0.1 μm, then the charge balance near the bird's beak 108c of the FOX 108 shown in FIG. 5 may not be reached. If the depth D2 of the p-type doped region 162 is greater than about 10 μm, then it may in turn adversely affect the semiconductor device 100.

In FIG. 3, a bottommost position B2 of the p-type doped region 162 aligns with a bottommost position B1 of the DNW 152. In some embodiments, the p-type doped region 162 may extend beyond the bottommost position B1 of the DNW 152. In some embodiments, the p-type doped region 162 is formed by selective diffusion.

Figure 4:
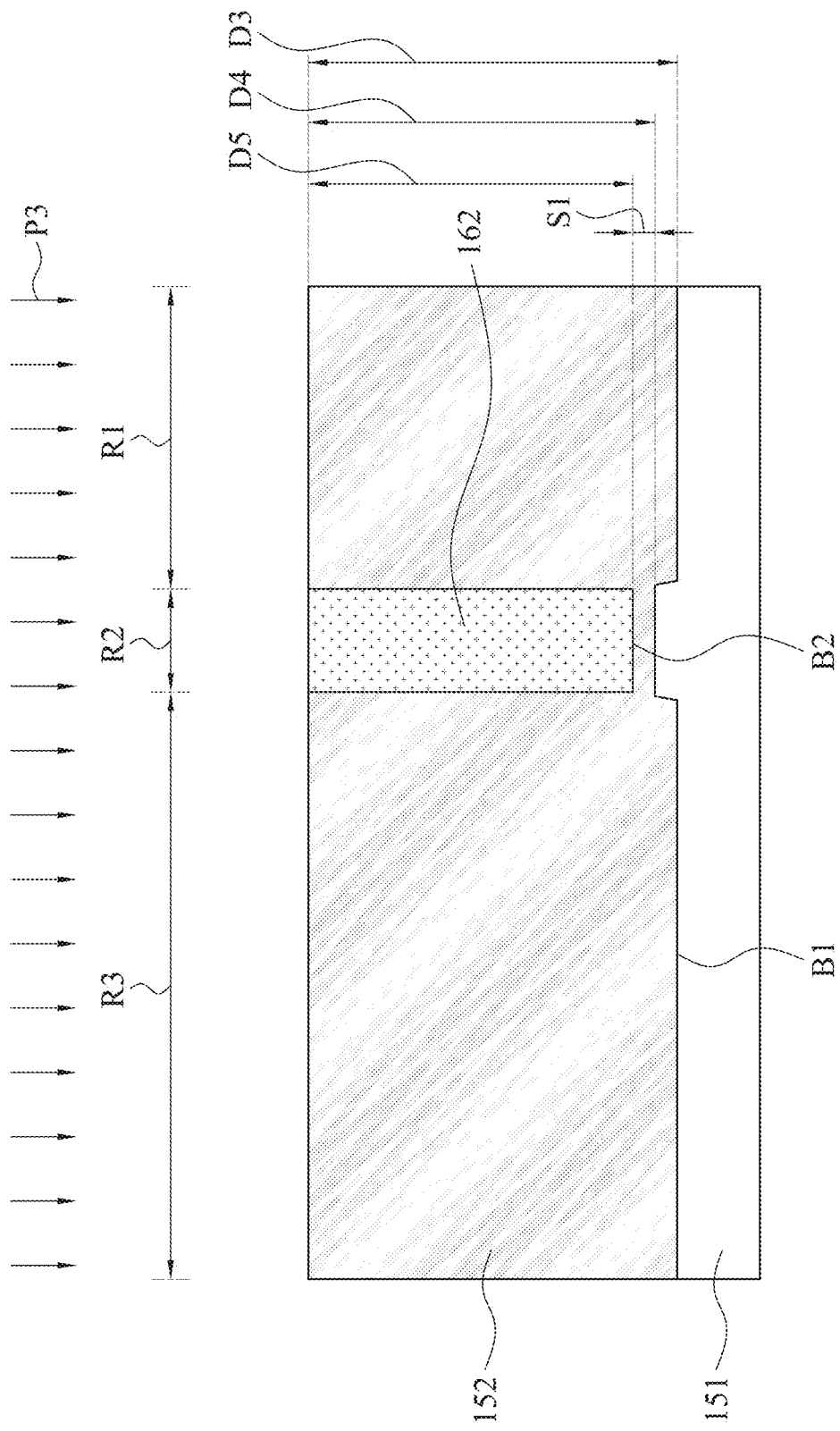

Returning to FIG. 1, the method M1 then proceeds to block S12 where, the semiconductor substrate is annealed to deepen bottommost positions of the DNW and the p-type doped region. With reference to FIG. 4, in some embodiments of block S12, the photoresist 161 is removed, and then an annealing process P3, such as a rapid thermal anneal or laser anneal, is performed to anneal the semiconductor substrate 151, which causes the impurities in the DNW 152 and the p-type doped region 162 to diffuse toward the semiconductor substrate 151 to deepen the bottommost position B1 of the DNW 152 and to deepen the bottommost position B2 of the p-type doped region 162. In some embodiments, the dopants for the DNW 152 and the p-type doped region 162 are driven in by heating the semiconductor substrate 151 to a temperature in a range from about 1000° C. to about 1100° C., by way of example and not limitation, and other temperature ranges are within the scope of the disclosure.

In greater detail, the semiconductor device 100 includes doped regions R1, R2, and R3 delimited in the laterally direction and each expanded in the vertical direction, and the delimitation of the doped regions R1, R2, and R3 delimited in the laterally direction is defined by vertical boundaries of the p-type doped region 162. After the annealing process P3 is complete, a depth D3 of the DNW 152 in the doped regions R1 and R3 is greater the depth D1 of the DNW 152 shown in FIG. 3 that is performed prior to the annealing process P3. A depth D4 of the DNW 152 in the doped region R2 is greater the depth D1 of the DNW 152 shown in FIG. 2 that is performed prior to the annealing process P3. A depth D5 of the p-type doped region 162 after the annealing process P3 is greater the depth D2 of the p-type doped region 162 shown in FIG. 3 that is performed prior to the annealing process P3.

In some embodiments, the n-type dopant has a higher diffusion rate than the p-type dopant during the annealing process P3, which results in the bottommost position B1 of the DNW 152 lower than the bottommost position B2 of the p-type doped region 162. Therefore, the bottommost position B2 of the p-type doped region 162 is spaced apart from the bottommost position B1 of the DNW 152 by a distance S1. In some embodiments, the n-type dopant in the doped region R1 or R3 has a higher diffusion rate than the n-type dopant in the doped region R2 during the annealing process P3, which results in the bottommost position B1 in the doped region R1 or R3 of the DNW 152 lower than the bottommost position B1 in the doped region R2 of the DNW 152.

Therefore, the bottommost position B1 of the DNW 152 in the doped region R1 or R3 is lower than the bottommost position B1 of the DNW 152 in the doped region R2. In other words, the depth D3 of the DNW 152 in the doped region R1 or R3 is deepen than the depth D4 of the DNW 152 in the doped region R2.

Returning to FIG. 1, the method M1 then proceeds to block S13 where a field oxide is formed on the semiconductor substrate. With reference to FIG. 5, in some embodiments of block S13, a nitride layer (not shown) includes a dielectric is deposited over the semiconductor substrate 151. The nitride layer may comprise a thickness of 1500 Angstroms, by way of example and not limitation, although the nitride layer may include other thicknesses. A photoresist (not shown) is deposited over the nitride layer. The photoresist is patterned with the desired pattern for the active region of the semiconductor device 100. The photoresist is used as a mask to pattern the nitride layer. For example, the nitride layer may be etched using a dry etch. After the nitride layer is patterned, the photoresist is stripped away, using $H_2SO_4$ as an example.

In FIG. 5, a field oxide (FOX) 108 and FOX 110 are formed over portions of the DNW 152 and the p-type doped region 162, using the nitride layer as a mask, and embedded into the semiconductor substrate 151. The FOX 108 overlaps a portion of the p-type doped region 162. The field oxides 108 and 110 may include a dielectric, such as silicon oxide, nitride, or other suitable insulating materials, deposited by heating the semiconductor substrate 151 in the presence of oxygen at a temperature of about 980 degrees C., and other temperatures are within the scope of the disclosure. In some embodiments, the field oxides 108 and 110 formed by a thermal oxidation process may cause a bird's beak 108*c*.

By way of example and not limitation, the field oxide 108 includes a lower inclined facet 108*a* and an upper inclined facet 108*d* forming a corner as the bird's beak 108*c* with the lower inclined facet 108*a*. In greater detail, the upper inclined facet 108*d* extends upwardly from the top surface of the semiconductor substrate 151 to a top surface 108*t* of the field oxide 108. The lower inclined facet 108*d* extends downwardly from the top surface of the semiconductor substrate 151 to a bottom surface 108*b* of the field oxide 108. By way of example and not limitation, an acute angle between the lower inclined facet 108*a* of FOX 108 and the top surface of the semiconductor substrate 151 is in a range from about 30 degrees to about 60 degrees, and other degree ranges are within the scope of the disclosure.

In some embodiments, the p-type doped region 162 is interfaced with the bird's beak 108*c* of the FOX 108. In FIG. 5, the p-type doped region 162 is in contact with the lower inclined facet 108*a* and the bottom surface 180*b* of the field oxide 108. In some embodiments, the p-type dopant of the p-type doped region 162 may diffuse into the FOX 108.

In some embodiments, the bottommost position of DNW 152 below the p-type doped region 162 is higher than the bottommost position of the DNW 152 below the FOX 108 and the FOX 110.

In some embodiments, the field oxide 108 or 110 may include a thickness of about 6000 Angstroms, by way of example and not limitation, although the field oxides 108 and 110 may alternatively include other thicknesses and materials. After the field oxides 108 and 110 are formed, the patterned nitride layer is then stripped or removed.

Figure 6:
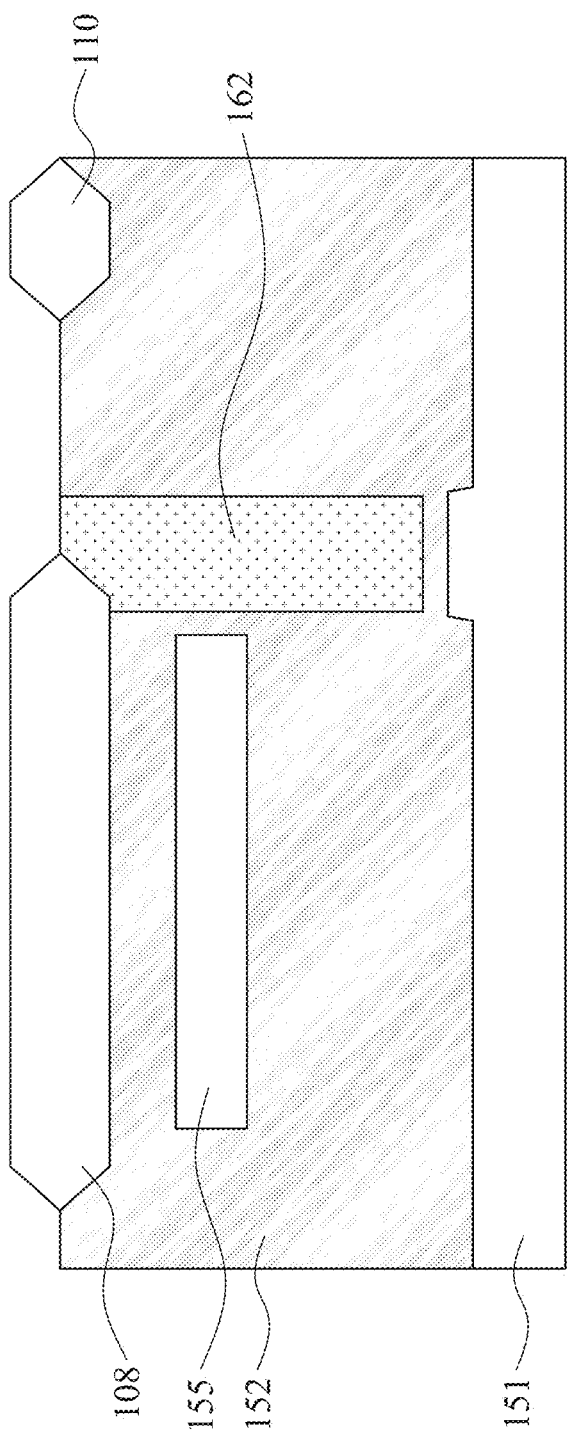

Returning to FIG. 1, the method M1 then proceeds to block S14 where a p-top region is formed in the DNW and directly below the FOX. With reference to FIG. 6, in some embodiments of block S14, a p-top region 155 (may be also referred to as a buried p-well region) is formed in the middle of the DNW 152 and under but not connected to FOX 108. The p-top region 155 is a floating layer and not connected to a source or a drain region of the semiconductor device 100 which will be formed hereafter. A bottommost position of the p-type doped region 162 is vertically between the bottommost position of the p-top region 155 and the bottommost position of the DNW 152. In some embodiments, a dopant concentration of p-type in the p-top region 155 is greater than a dopant concentration of p-type in the p-type doped region 162. In greater detail, a dopant concentration of a p-type dopant in the p-top region 155 is greater than a dopant concentration of a p-type dopant in the p-type doped region 162. By way of example and not limitation, the p-top region 155 has a concentration of a p-type dopant, such as boron, that is in a range from about $1.0 \times 10^{13}$ atoms/centimeter$^3$ to about $1.0 \times 10^{16}$ atoms/centimeter$^3$ and other concentration ranges are within the scope of the disclosure.

In some embodiments, a difference between a concentration of the p-type dopant in the p-top region 155 and a concentration of the p-type dopant in the p-type doped region 162 may be less than three orders of magnitude, such that the p-type doped region 162 may have sufficient concentration of the p-type dopant to reach a charge balance near the source region, thereby achieving an improved breakdown voltage for the semiconductor device 100. In other words, the concentration of the p-type dopant in the p-top region 155 may be greater than the concentration of the p-type dopant in the p-type doped region 162 and lower than about one thousand times the concentration of the p-type dopant in the p-type doped region 162. If the difference between the concentration of the p-type dopant in the p-top region 155 and the concentration of the p-type dopant in the p-type doped region 162 is greater than three orders of magnitude, it may in turn adversely affect the breakdown voltage. By way of example and not limitation, a concentration of the p-type dopant that in the p-top region 155 may be about $1.0 \times 10^{16}$ atoms/centimeter$^3$, and a concentration of the p-type dopant that in the p-type doped region 162 may be about $1.0 \times 10^{15}$ atoms/centimeter$^3$, and other concentrations are within the scope of the disclosure. In some embodiments, the difference between the concentration of the p-type dopant in the p-top region 155 and the concentration of the p-type dopant in the p-type doped region 162 may be less than two orders of magnitude. In other words, the concentration of the p-type dopant in the p-top region 155 may be greater than the concentration of the p-type dopant in the p-type doped region 162 and lower than about one hundred times the concentration of the p-type dopant in the p-type doped region 162.

Figure 7:
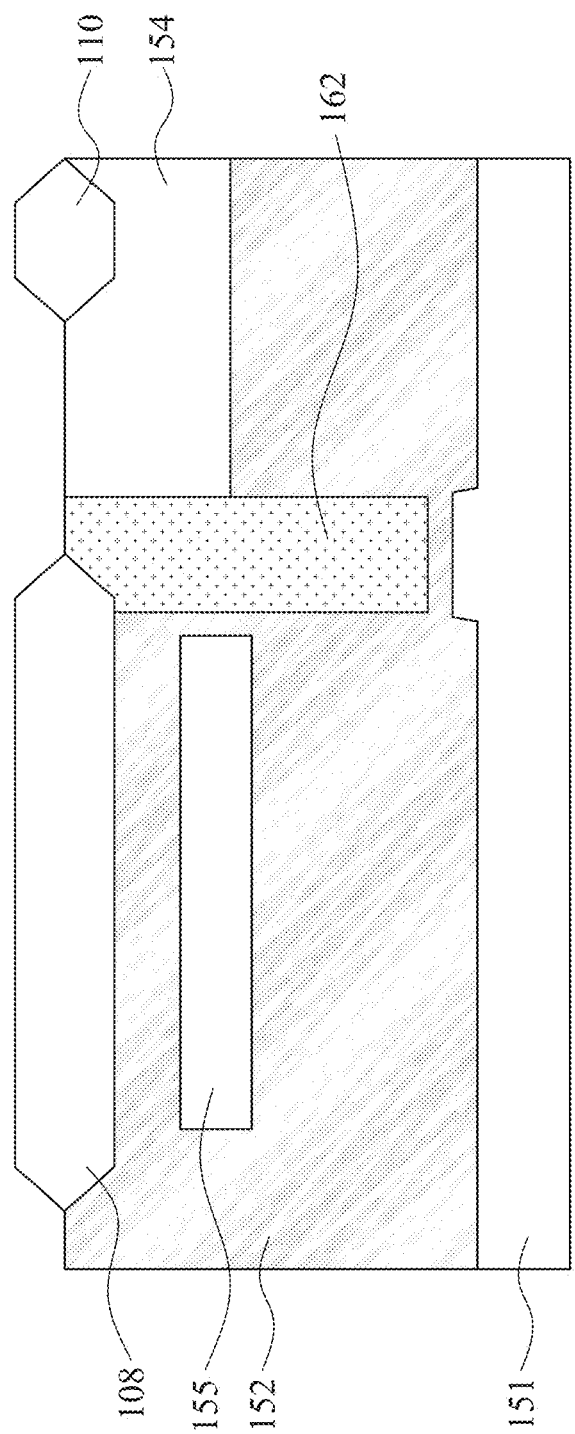

Returning to FIG. 1, the method M1 then proceeds to block S15 where a p-well is formed in the DNW and in the vicinity of the p-type doped region. With reference to FIG. 7, in some embodiments of block S15, a p-well 154 (which may be also referred to as a p-body) is formed by implanting the semiconductor substrate 151 with a p-type dopant, such as boron, and subjecting the p-well 154 to an annealing process, such as a rapid thermal anneal or laser anneal. Alternatively, the p-well 154 may be formed by another suitable process, such as a diffusion process.

In FIG. 7, the p-well 154 extends downwardly from the top surface of the semiconductor substrate 151, is adjacent to the p-type doped region 162, and a portion of the p-well 154 is below the FOX 110. The bottommost position of the p-type doped region 162 is vertically between the bottommost position of the p-well 154 and the bottommost position of the DNW 152. In some embodiments, a dopant concentration of p-type in the p-well 154 is greater than a dopant concentration of p-type in the p-type doped region 162. In greater detail, a dopant concentration of a p-type dopant in the p-well 154 is greater than a dopant concentration of a p-type dopant in the p-type doped region 162. By way of example and not limitation, the p-well 154 has a concentration of a p-type dopant, such as boron, that is in a range from about $1.0 \times 10^{14}$ atoms/centimeter$^3$ to about $1.0 \times 10^{17}$ atoms/centimeter$^3$ and other concentration ranges are within the scope of the disclosure.

In some embodiments, a difference between a concentration of the p-type dopant in the p-well 154 and a concentration of the p-type dopant in the p-type doped region 162 may be less than three orders of magnitude, such that the p-type doped region 162 may have sufficient concentration of the p-type dopant to reach a charge balance near the source region, thereby achieving an improved breakdown voltage for the semiconductor device 100. In other words, the concentration of the p-type dopant in the p-well 154 may be greater than the concentration of the p-type dopant in the p-type doped region 162 and lower than about one thousand times the concentration of the p-type dopant in the p-type doped region 162. If the difference between the concentration of the p-type dopant in the p-well 154 and the concentration of the p-type dopant in the p-type doped region 162 is greater than three orders of magnitude, it may in turn adversely affect the breakdown voltage. By way of example and not limitation, a concentration of the p-type dopant that in the p-top region 155 may be about $1.0 \times 10^{16}$ atoms/centimeter$^3$, and a concentration of the p-type dopant that in the p-type doped region 162 may be about $1.0 \times 10^{15}$ atoms/centimeter$^3$, and other concentrations are within the scope of the disclosure. In some embodiments, the difference between the concentration of the p-type dopant in the p-well 154 and the concentration of the p-type dopant in the p-type doped region 162 may be less than two orders of magnitude. In other words, the concentration of the p-type dopant in the p-well 154 may be greater than the concentration of the p-type dopant in the p-type doped region 162 and lower than about one hundred times the concentration of the p-type dopant in the p-type doped region 162.

Figure 8:
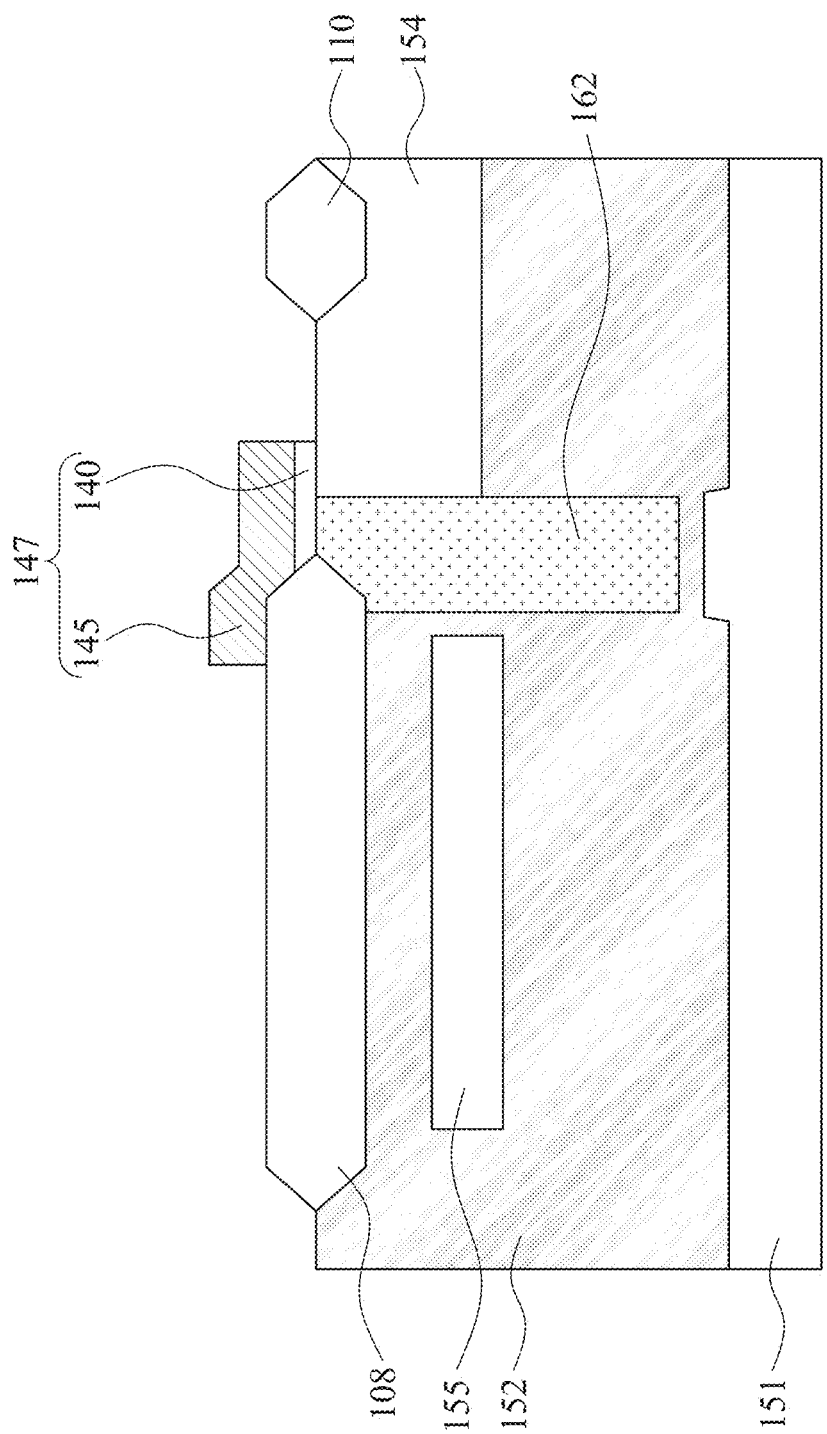

Returning to FIG. 1, the method M1 then proceeds to block S16 where a gate structure is formed on the semiconductor substrate. With reference to FIG. 8, in some embodiments of block S16, a gate structure 147 includes a gate dielectric 140 formed on the semiconductor substrate 151, and a gate electrode 145 formed on the gate dielectric 140. The gate dielectric 140 has a first portion overlying the p-type doped region 162 and a second portion overlying the p-well 154. In some embodiments, the p-type dopant of the p-type doped region 162 may diffuse into the gate dielectric 140.

The gate dielectric 140 may include a silicon dioxide (referred to as silicon oxide) layer suitable for high voltage applications. Alternatively, the gate dielectric 140 may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, $HfO_2$, or combinations thereof. The gate dielectric 140 may have a multilayer structure, such as one layer of silicon oxide and another layer of high-k material. The gate dielectric 240 may be formed using chemical vapor deposition (CVD), physical vapor deposition (PVD), atomic layer deposition (ALD), thermal oxide, other suitable processes, or combinations thereof.

The gate electrode 145 may be configured to be coupled to metal interconnects and may be disposed overlying the gate dielectric 140. The gate electrode 145 may include a doped or non-doped polycrystalline silicon (or polysilicon). Alternatively, the gate electrode 145 may include a metal, such as Al, Cu, W, Ti, Ta, TiN, TaN, NiSi, CoSi, other suitable conductive materials, or combinations thereof. The gate electrode 145 may be formed by CVD, PVD, ALD, plating, and other proper processes. The gate electrode layer may have a multilayer structure and may be formed in a multiple-step process.

Figure 9:
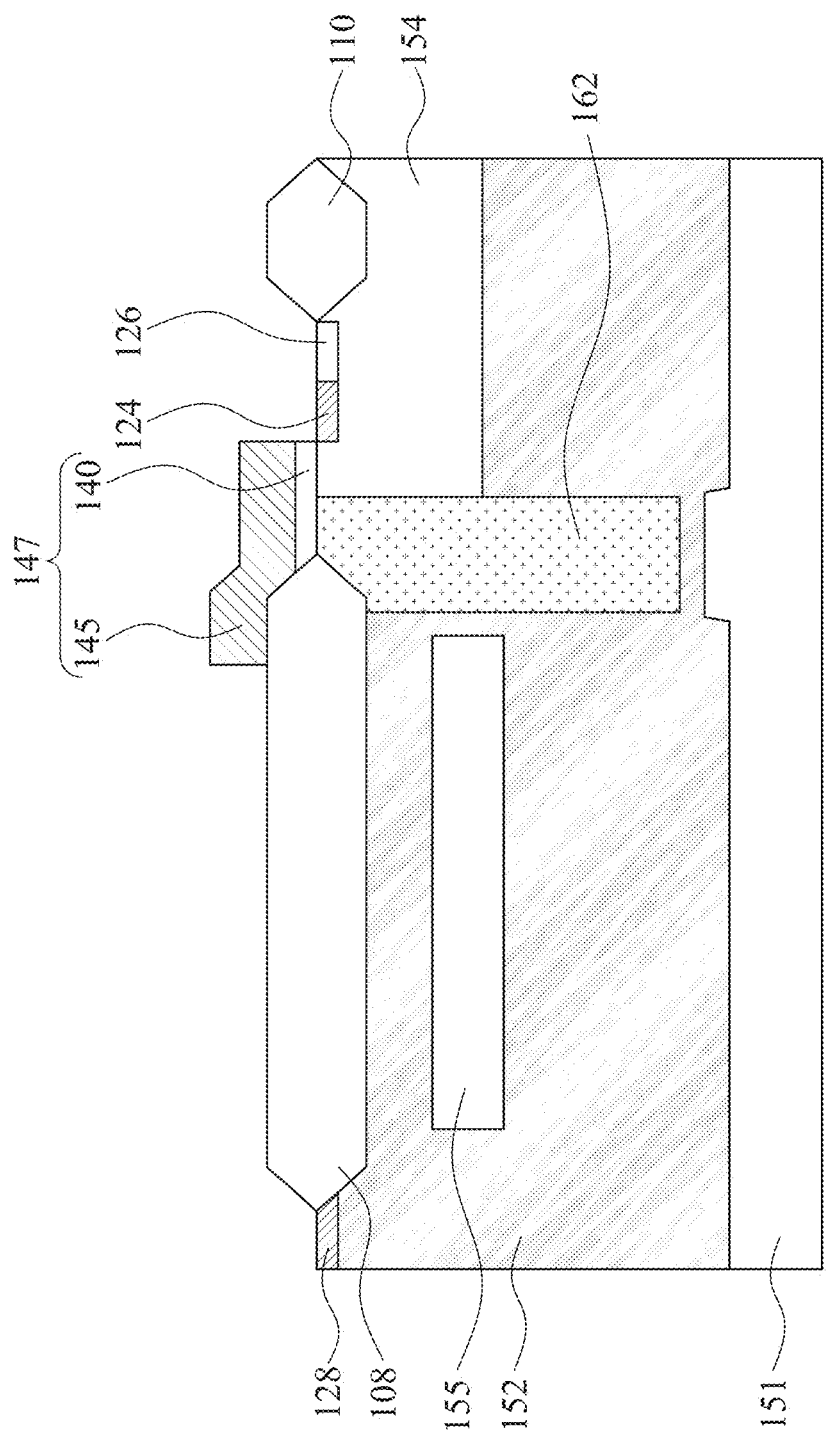

Returning to FIG. 1, the method M1 then proceeds to block S17 where drain and source are formed in the DNW and the p-well, respectively. With reference to FIG. 9, in some embodiments of block S17, a drain 128 may be formed in the DNW 152 and a source is formed in an upper portion of the p-well 154. The FOX 108 separates the gate structure 147 from the drain 128. In FIG. 9, the source has two oppositely doped regions 124 and 126, both formed in the upper portion of the p-well 154. The source's first region 124 and drain 128 may have the first type of conductivity, and the source's second region 126 may have the second type of conductivity. By way of example and not limitation, the source's first region 124 and drain 128 include n-type dopants, such as phosphorum (P) or arsenic (As), and the source's second region 126 includes p-type dopants, such as boron (B). Alternatively, the source could have one type of conductivity. The source and drain may be positioned on both sides of the gate structure 147. The source and drain may be formed by a method, such as ion implantation or diffusion. A rapid thermal annealing (RTA) process may be used to activate the implanted dopants.

In some embodiments, a dopant concentration of n-type in the source's first region 124 is greater than a dopant concentration of p-type in the p-type doped region 162. In some embodiments, a dopant concentration of n-type in the drain 128 is greater than a dopant concentration of p-type in the p-type doped region 162. In some embodiments, a dopant concentration of p-type in the source's second region 126 is greater than a dopant concentration of p-type in the p-type doped region 162. By way of example and not limitation, a concentration of the n-type dopant in the source's first region 124 may be in a range from about $1.0 \times 10^{19}$ atoms/centimeter$^3$ to about $1.0 \times 10^{21}$ atoms/centimeter$^3$, a concentration of the n-type dopant in the drain 128 may be in a range from about $1.0 \times 10^{19}$ atoms/centimeter$^3$ to about $1.0 \times 10^{21}$ atoms/centimeter$^3$ and a concentration of the p-type dopant in the source's second region 126 may be in a range from about $1.0 \times 10^{19}$ atoms/centimeter$^3$ to about $1.0 \times 10^{21}$ atoms/centimeter$^3$, and other concentration ranges are within the scope of the disclosure.

In some embodiments, a difference between a concentration of the n-type dopant in the first region 124 of the source and a concentration of the p-type dopant in the p-type doped region 162 may be less than five orders of magnitude, such that the p-type doped region 162 may have sufficient concentration of the p-type dopant to reach a charge balance near the source region, thereby achieving an improved breakdown voltage for the semiconductor device 100. In other words, the concentration of the n-type dopant in the first region 124 of the source may be greater than the concentration of the p-type dopant in the p-type doped region 162 and lower than about one hundred thousand times the concentration of the p-type dopant in the p-type doped region 162. If the difference between the concentration of the n-type dopant in the first region 124 of the source and the concentration of the p-type dopant in the p-type doped region 162 is greater than five orders of magnitude, it may in turn adversely affect the breakdown voltage. By way of example and not limitation, a concentration of the n-type dopant in the first region 124 may be about $1.0 \times 10^{19}$ atoms/centimeter$^3$, and a concentration of the p-type dopant that in the p-type doped region 162 may be about $1.0 \times 10^{15}$ atoms/centimeter$^3$, and other concentrations are within the scope of the disclosure.

In some embodiments, a difference between a concentration of the p-type dopant in the second region 126 of the source and a concentration of the p-type dopant in the p-type doped region 162 may be less than five orders of magnitude, such that the p-type doped region 162 may have sufficient concentration of the p-type dopant to reach a charge balance near the source region, thereby achieving an improved breakdown voltage for the semiconductor device 100. In other words, the concentration of the p-type dopant in the second region 126 of the source may be greater than the concentration of the p-type dopant in the p-type doped region 162 and lower than about one hundred thousand times the concentration of the p-type dopant in the p-type doped region 162. If the difference between the concentration of the p-type dopant in the second region 126 of the source and the concentration of the p-type dopant in the p-type doped region 162 is greater than five orders of magnitude, it may in turn adversely affect the breakdown voltage. By way of example and not limitation, a concentration of the p-type dopant in the second region 126 may be about $1.0 \times 10^{19}$ atoms/centimeter$^3$, and a concentration of the p-type dopant that in the p-type doped region 162 may be about $1.0 \times 10^{15}$ atoms/centimeter$^3$, and other concentrations are within the scope of the disclosure.

In some embodiments, a difference between a concentration of the n-type dopant in the drain 128 and a concentration of the p-type dopant in the p-type doped region 162 may be less than five orders of magnitude, such that the p-type doped region 162 may have sufficient concentration of the p-type dopant to reach a charge balance near the source region, thereby achieving an improved breakdown voltage for the semiconductor device 100. In other words, the concentration of the n-type dopant in the drain 128 may be greater than the concentration of the p-type dopant in the p-type doped region 162 and lower than about one hundred thousand times the concentration of the p-type dopant in the p-type doped region 162. If the difference between the concentration of the n-type dopant in the drain 128 and the concentration of the p-type dopant in the p-type doped region 162 is greater than five orders of magnitude, it may in turn adversely affect the breakdown voltage. By way of example and not limitation, a concentration of the n-type dopant in the drain 128 may be about $1.0 \times 10^{19}$ atoms/centimeter$^3$, and a concentration of the p-type dopant that in the p-type doped region 162 may be about $1.0 \times 10^{15}$ atoms/centimeter$^3$, and other concentrations are within the scope of the disclosure.

In some embodiments, the difference between the concentration of the n-type dopant in the drain 128 and the concentration of the p-type dopant in the p-type doped region 162 may be less than four or three orders of magnitude. In some embodiments, the difference between the concentration of the p-type dopant in the second region 126 of the source and the concentration of the p-type dopant in the p-type doped region 162 may be less than four or three orders of magnitude. In some embodiments, the difference between the concentration of the n-type dopant in the drain 128 and the concentration of the p-type dopant in the p-type doped region 162 may be less than four or three orders of magnitude.

Figure 10:
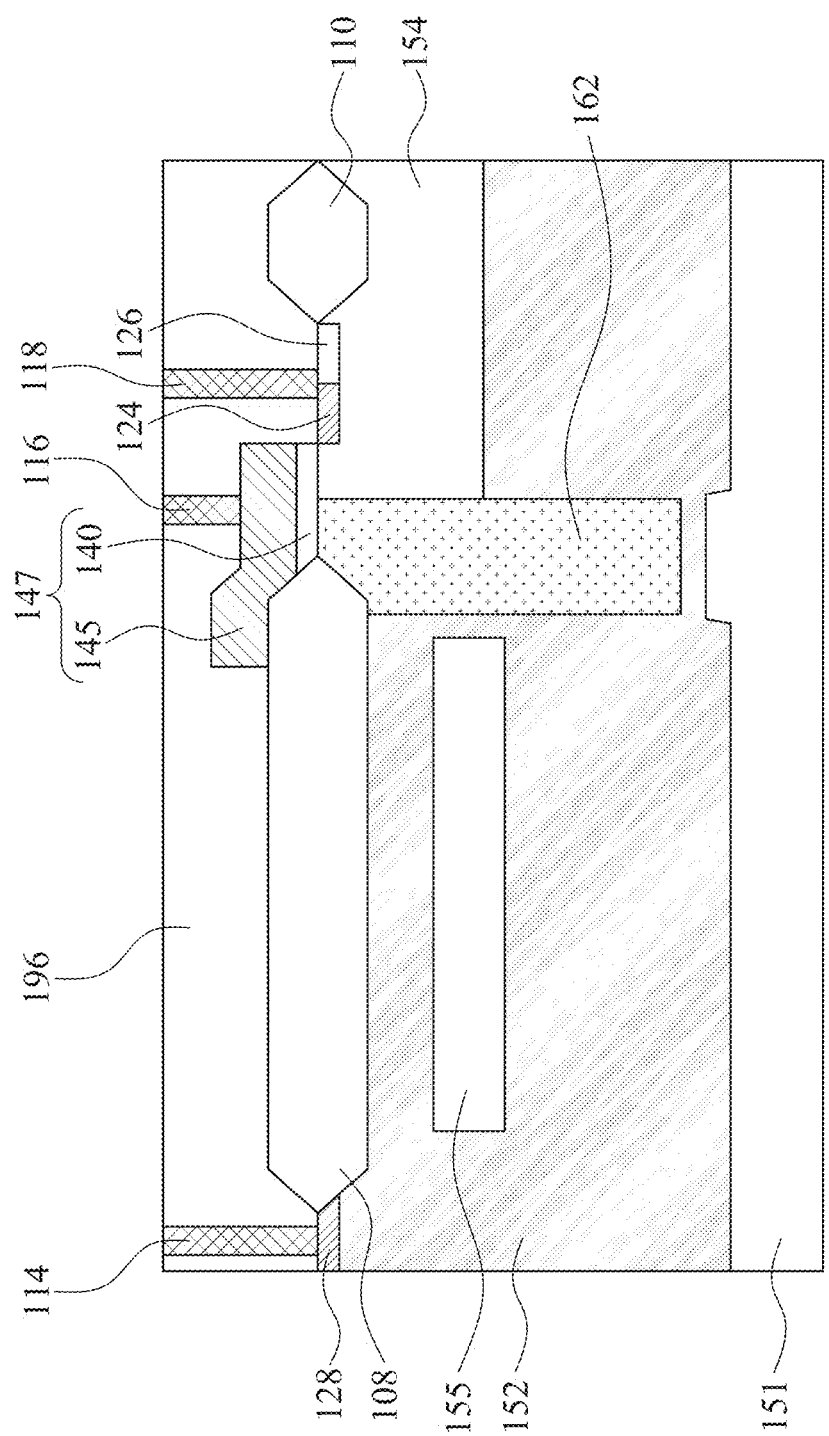

Returning to FIG. 1, the method M1 then proceeds to block S18 where a plurality of contacts are formed in the interlayer dielectric layer to contact the gate structure, drain, and source, respectively. With reference to FIG. 10, in some embodiments of block S18, an interlayer dielectric (ILD) layer 196 is formed above the structure in FIG. 9. In some embodiments, the ILD layer 196 includes a material having a low dielectric constant such as a dielectric constant less than about 3.9. For example, the ILD layer 196 may include silicon oxide. In some embodiments, the dielectric layer includes silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (his-benzocyclobutenes), SiLK (Dow Chemical, Midland, Mich.), polyimide, and/or other suitable materials. The ILD 196 layer may be formed by a technique including spin-on coating, CVD, or other suitable processes.

Then, a plurality of contacts 116, 114, and 118 are formed in the ILD layer 196 to contact the gate structure 147, the drain 128, and the regions 124 and 126 of the source. For example, a plurality of the openings are formed in the ILD layer 196, and conductive materials are then deposited in the openings. The excess portions of the conductive materials outside the openings are removed by using a CMP process, while leaving portions in the openings to serve as the contacts 116, 114, and 118. The contacts 116, 114, and 118 may be made of tungsten, aluminum, copper, or other suitable materials. In some embodiments, the contact 116 is electrically connected to the gate structure 147, the contact 114 is connected to the drain 128, and the contact 118 is connected to the regions 124 and 126 of the source.

Figure 11:
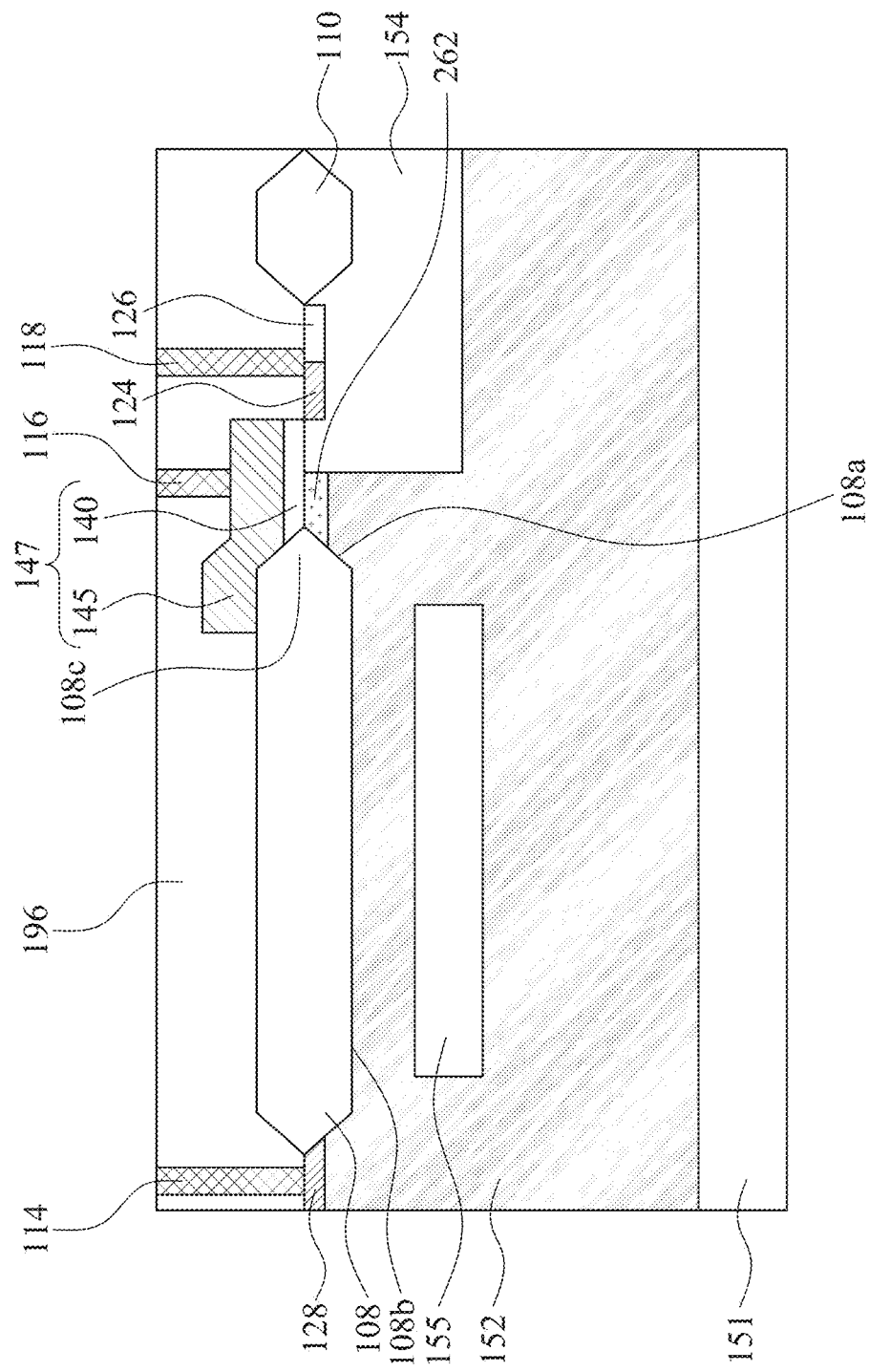
FIG. 11 illustrates a method for manufacturing a semiconductor device in a stage in accordance with some embodiments.

Reference is made to FIG. 11. FIG. 11 illustrates a method for manufacturing a semiconductor device 200 in different stages in accordance with some embodiments. Operations for forming the semiconductor device 200 are substantially the same as the operations for forming the semiconductor device 100 described in foregoing descriptions and thus are not repeated herein for the sake of clarity. FIG. 11 illustrates another profile of the LDMOS manufactured using the method M1 than the semiconductor device 100. FIG. 11 illustrates a semiconductor device 200 at a stage corresponding to FIG. 10 according to some alternative embodiments of the present disclosure. As shown in FIG. 11, the p-type doped region 262 is interfaced with the bird's beak 108c of the FOX 108. In greater detail, a bottommost position of the p-type doped region 262 is higher than a bottom surface of the FOX 108. The p-type doped region 262 is in contact with the lower inclined facet 108a of the FOX 108 and free from the bottom surface 108b of the FOX 108.

Figure 12:
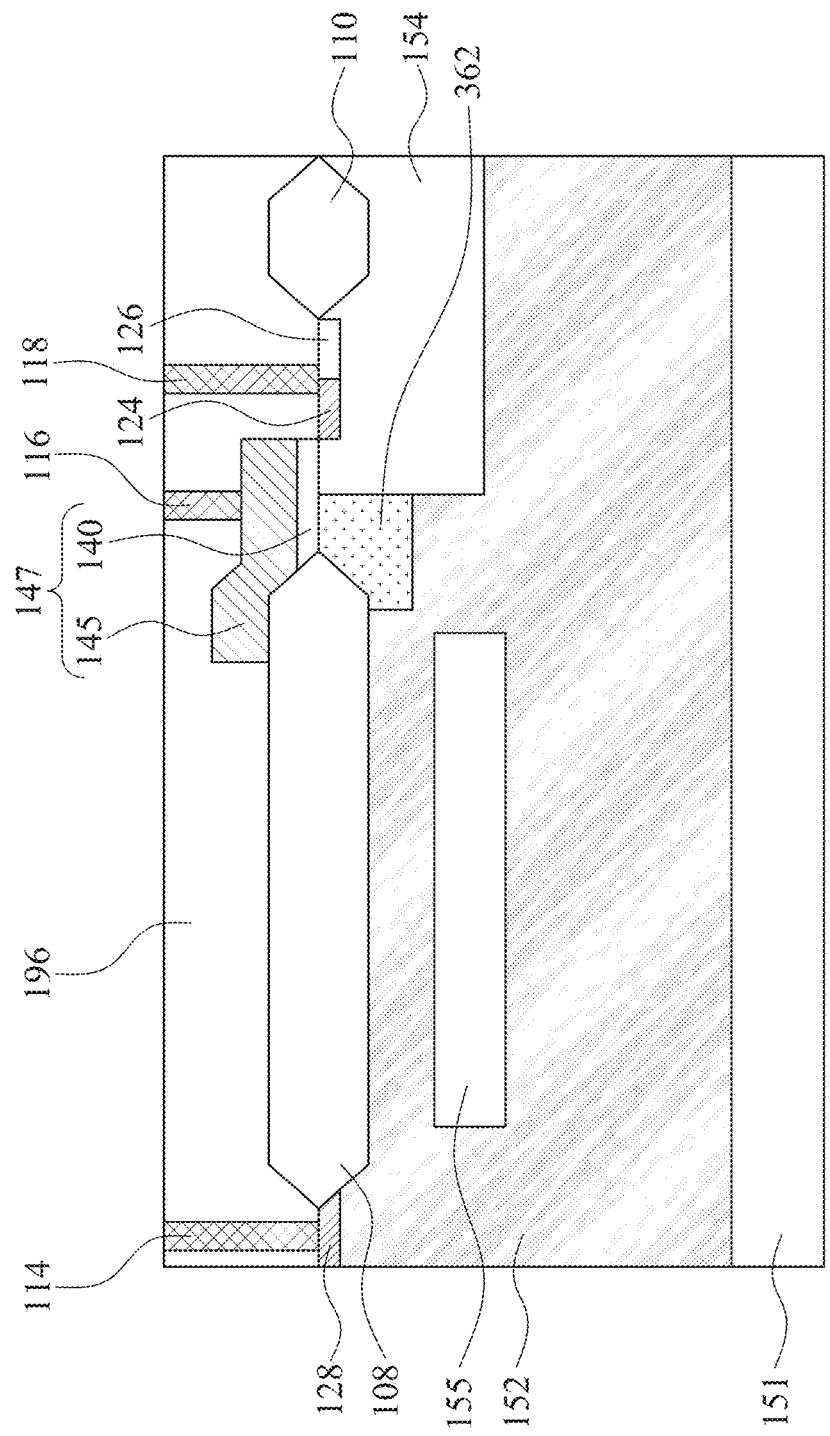
FIG. 12 illustrates a method for manufacturing a semiconductor device in a stage in accordance with some embodiments.

Reference is made to FIG. 12. FIG. 12 illustrates a method for manufacturing a semiconductor device 300 in different stages in accordance with some embodiments. Operations for forming the semiconductor device 300 are substantially the same as the operations for forming the semiconductor device 100 described in foregoing descriptions and thus are not repeated herein for the sake of clarity. FIG. 12 illustrates another profile of the LDMOS manufactured using the method M1 than the semiconductor device 100. FIG. 12 illustrates a semiconductor device 300 at a stage corresponding to FIG. 10 according to some alternative embodiments of the present disclosure. As shown in FIG. 12, the p-type doped region 362 is interfaced with the bird's beak 108c of the FOX 108. In greater detail, a bottommost position of the p-type doped region 362 is lower than the bottom surface of the FOX 108 and is higher than a bottommost position of the p-well 154 and an upper boundary of the p-top region 155.

Figure 13:
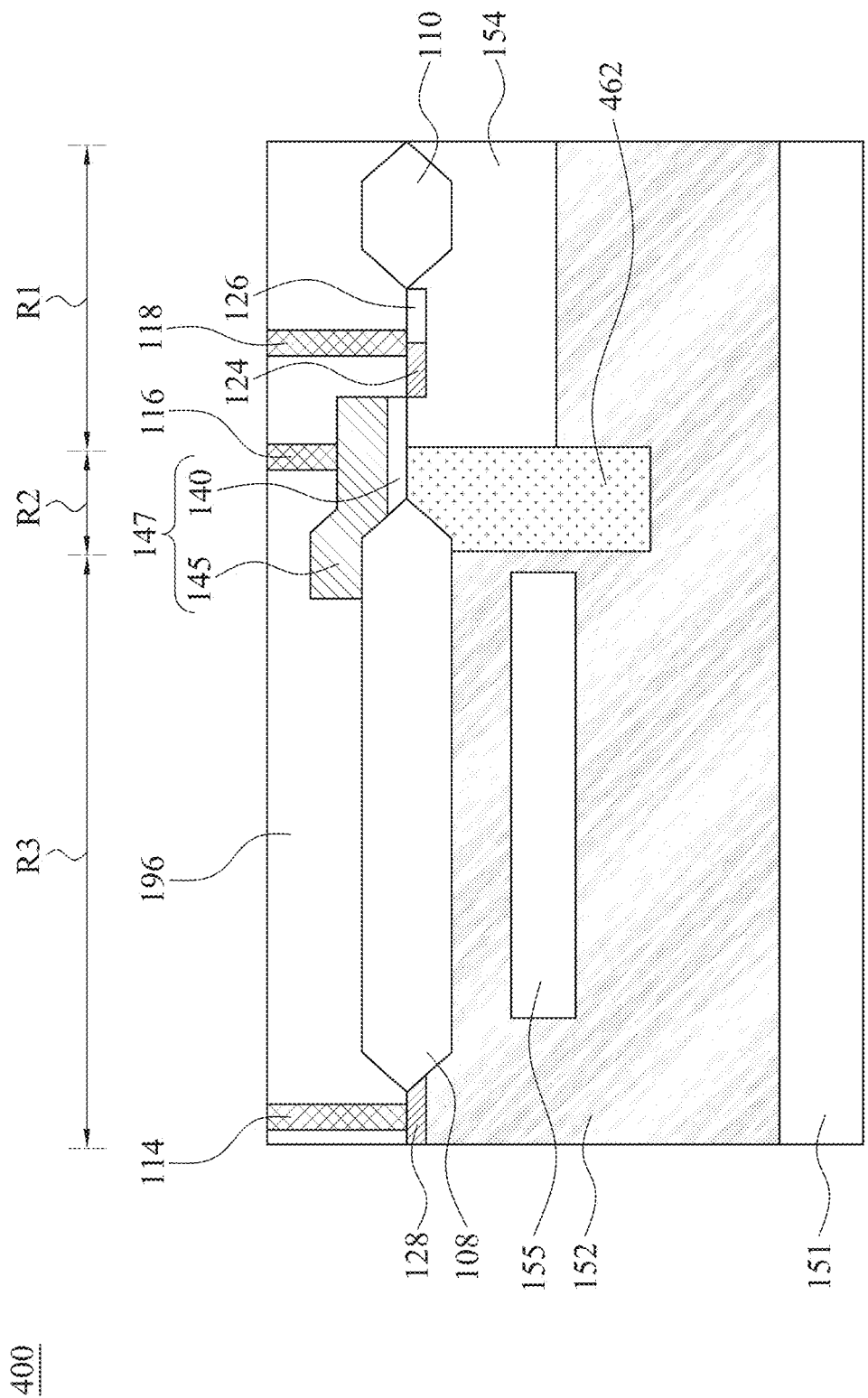
FIG. 13 illustrates a method for manufacturing a semiconductor device in a stage in accordance with some embodiments.

Reference is made to FIG. 13. FIG. 13 illustrates a method for manufacturing a semiconductor device 400 in different stages in accordance with some embodiments. Operations for forming the semiconductor device 400 are substantially the same as the operations for forming the semiconductor device 100 described in foregoing descriptions and thus are not repeated herein for the sake of clarity. FIG. 13 illustrates another profile of the LDMOS manufactured using the method M1 than the semiconductor device 100. FIG. 13 illustrates a semiconductor device 400 at a stage corresponding to FIG. 10 according to some alternative embodiments of the present disclosure. As shown in FIG. 13, the p-type doped region 462 is interfaced with the bird's beak 108c of the FOX 108. In greater detail, a bottommost position of the p-type doped region 462 is vertically between the bottommost position of the p-well 154 and the bottommost position of the DNW 152. In FIG. 13, the bottommost position of the DNW 152 below the p-type doped region 462 in the doped region R2 is in a position substantially level with the bottommost position of the DNW 152 below in the doped regions R1 and R3.

Figure 14:
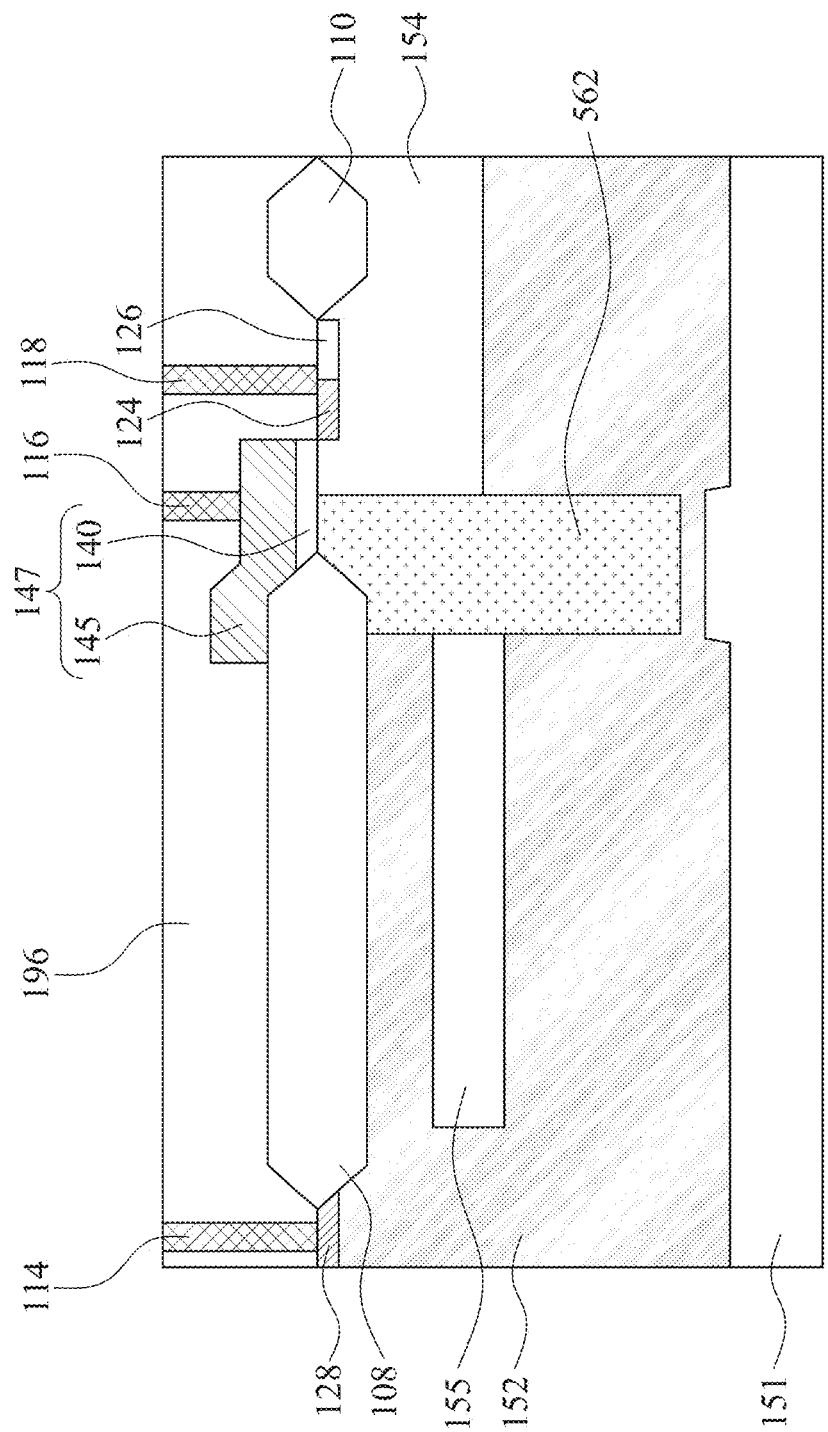
FIG. 14 illustrates a method for manufacturing a semiconductor device in a stage in accordance with some embodiments.

Reference is made to FIG. 14. FIG. 14 illustrates a method for manufacturing a semiconductor device 500 in different stages in accordance with some embodiments. Operations for forming the semiconductor device 500 are substantially the same as the operations for forming the semiconductor device 100 described in foregoing descriptions and thus are not repeated herein for the sake of clarity. FIG. 14 illustrates another profile of the LDMOS manufactured using the method M1 than the semiconductor device 100. FIG. 14 illustrates a semiconductor device 500 at a stage corresponding to FIG. 10 according to some alternative embodiments of the present disclosure. As shown in FIG. 14, the p-type doped region 562 is in contact with the p-top region 155.

Figure 15:
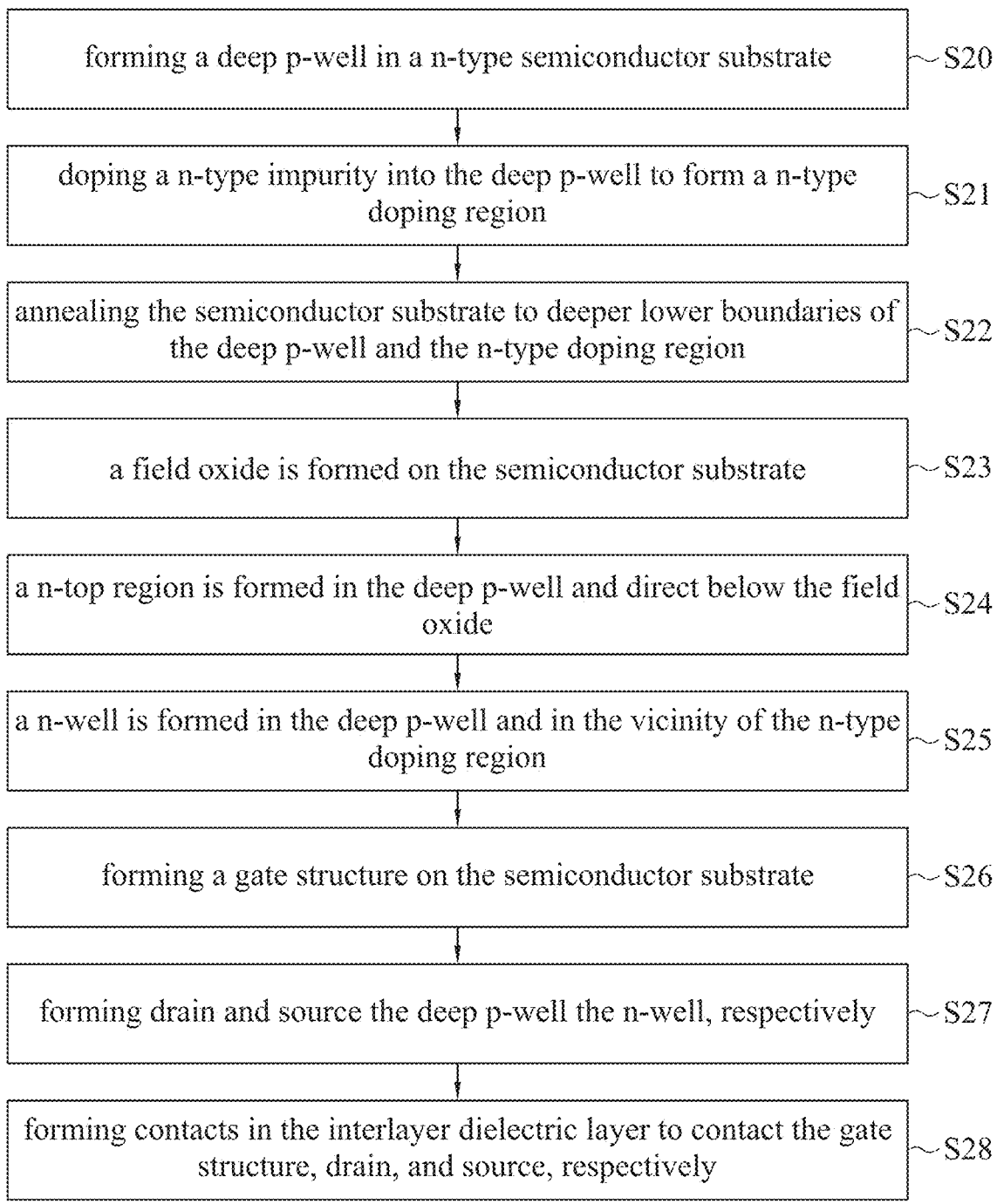
FIG. 15 illustrates a block diagram of a method of forming a semiconductor device in accordance with some embodiments.
Figure 16:
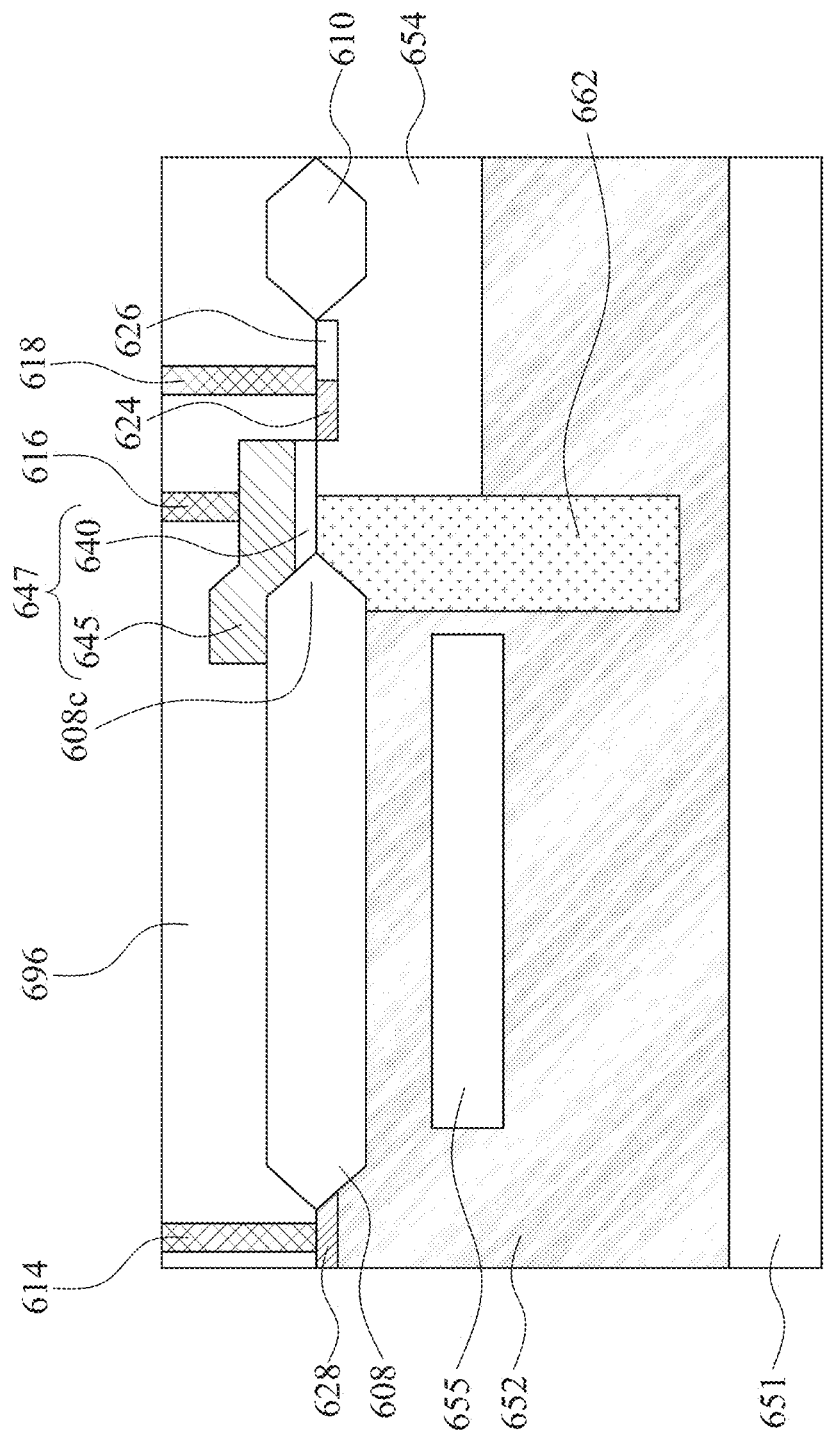
FIG. 16 illustrates a method for manufacturing a semiconductor device in a stage in accordance with some embodiments.

Referring now to FIG. 15, illustrated is an exemplary method M2 for fabrication of a semiconductor device in accordance with some embodiments, in which the fabrication includes a semiconductor device with an additional p-type doped region that is interfaced with a bird's beak of a field oxide below a gate structure. FIG. 16 illustrates an LDMOS transistor fabricated using the method M2. The method M2 includes a relevant part of the entire manufacturing process. It is understood that additional operations may be provided before, during, and after the operations shown by FIG. 15, and some of the operations described below can be replaced or eliminated for additional embodiments of the method. The order of the operations/processes may be interchangeable. The method M2 includes fabrication of a semiconductor device 600. However, the fabrication of the semiconductor device 600 is merely example for describing the self-aligned process of the semiconductor device 600 according to some embodiments of the present disclosure.

With reference to FIG. 16, at block S20, a deep p-well 652 is formed in a n-type semiconductor substrate 651. In some embodiments, illustrated as a p-type MOS, the semiconductor substrate 651 includes a n-type silicon substrate (n-substrate). For example, n-type impurities (e.g., Arsenic (As)) are doped into the semiconductor substrate 651 to form the n-substrate. To form a complementary MOS, a p-type buried layer, i.e., deep p-well (DPW) 652 (may be also referred to as a p-drift region), may be implanted deeply under the active region of the semiconductor substrate 651. In some embodiments, boron ions may be implanted to form the DPW 652.

At block S21, an n-type impurity is doped into the DPW 652 to form an n-type doped region 662. A high energy n-type dopant implantation process is then performed in order to form the n-type doped region 662 through a photoresist. By way of example and not limitation, the n-type doped region 662 is formed by implanting the DPW 652 with an n-type dopant, such as phosphorum (P) or arsenic (As). In some embodiments, a breakdown voltage of the semiconductor device 600 is limited by an electric field peak which may take place in the vicinity of a bird's beak of a FOX 608, and the electric field peak may lead to a device breakdown failure. By way of example, the device breakdown failure may occur when the DPW 652 has not been fully depleted through the semiconductor substrate 651 since a dopant concentration of p-type may be higher than a dopant concentration of n-type to some extent near the bird's beak of the FOX 608, which in turn adversely affects the electric field. Therefore, a p-type dopant is implant into the n-type doped region 662 (i.e., the vicinity of the bird's beak 608c of the FOX 608 near the source region) in the DPW 652, such that a dopant concentration of n-type near the source region is increased, and thus a charge balance is reached. Therefore, the electric field peak may be reduced, thereby achieving an improved breakdown voltage for the semiconductor device 600.

In some embodiments, a dopant concentration of n-type is lower than a dopant concentration of p-type in the n-type doped region 662. In some embodiments, a dopant concentration of n-type in the n-type doped region 662 is lower than a dopant concentration of p-type in the DPW 652. By way of example and not limitation, a concentration of the n-type dopant in the n-type doped region 662 is lower than a concentration of a p-type dopant in the DPW 652. In some embodiments, a concentration of the n-type dopant in the n-type doped region 662 is at the same order of magnitude as a concentration of the p-type dopant in the DPW 652. That is, the concentration of the p-type dopant in the DPW 652 is greater than the concentration of the n-type dopant in the n-type doped region 662 and lower than about ten times the concentration of the n-type dopant in the n-type doped region 662. In other words, a difference between the concentration of the n-type dopant in the n-type doped region 662 and the concentration of the p-type dopant in the DPW 652 may be less than an order of magnitude.

At block S22, the semiconductor substrate is annealed to deepen bottommost positions of the DPW 652 and the n-type doped region 662. In some embodiments, the dopants for the DPW 652 and the n-type doped region 662 are driven in by heating the semiconductor substrate 651 to a temperature in a range from about 1000° C. to about 1100° C., by way of example and not limitation, and other temperature ranges are within the scope of the disclosure. In some embodiments, the n-type dopant has a lower diffusion rate than the p-type dopant during the annealing process, which results in the bottommost position of the n-type doped region 662 higher than the bottommost position of the DPW 652.

At block S23, field oxide (FOX) 608 and FOX 610 are formed over portions of the DPW 652 and the n-type doped region 662. The FOX 608 overlaps a portion of the n-type doped region 662. In some embodiments, the field oxides 608 and 610 formed by a thermal oxidation process may cause a bird's beak 608c. By way of example and not limitation, the field oxide 608 includes a lower inclined facet and an upper inclined facet forming a corner as the bird's beak with the lower inclined facet. In some embodiments, the n-type doped region 662 is interfaced with the bird's beak of the FOX 608. In FIG. 16, the n-type doped region 662 is in contact with the lower inclined facet and the bottom surface of the field oxide 608. In some embodiments, the n-type dopant of the n-type doped region 662 may diffuse into the FOX 608.

At block S24, an n-top region 655 is formed in the DPW 652 and directly below the FOX 608. An n-top region 655 (may be also referred to as a buried n-well region) is formed in the middle of the DPW 652 and under but not connected to FOX 608. The n-top region 655 is a floating layer and not connected to a source or a drain region of the semiconductor device 600. By way of example and not limitation, the n-top region 655 has a concentration of an n-type dopant, such as phosphorum (P) or phosphorum (As), In some embodiments, a dopant concentration of n-type in the n-top region 655 is greater than a dopant concentration of n-type in the n-type doped region 662. In some embodiments, a difference between a dopant concentration of n-type in the n-top region 655 and a dopant concentration of n-type in the n-type doped region 662 may be less than three orders of magnitude. In other words, the dopant concentration of n-type in the n-top region 655 is greater than the dopant concentration of n-type in the n-type doped region 662 and lower than about one thousand times the dopant concentration of n-type in the n-type doped region 662. In some embodiments, the difference between the concentration of the n-type dopant in the n-top region 655 and the concentration of the n-type dopant in the n-type doped region 662 may be less than two orders of magnitude. In other words, the dopant concentration of n-type in the n-top region 655 is greater than the dopant concentration of n-type in the n-type doped region 662 and lower than about one hundred times the dopant concentration of n-type in the n-type doped region 662.

At block S25, an n-well 654 is formed in the DPW 652 and in the vicinity of the n-type doped region 662. The n-well 654 (which may be also referred to as a n-body) is formed by implanting the semiconductor substrate 651 with a n-type dopant, such as phosphorum (P) or arsenic (As), and subjecting the n-well 654 to an annealing process, such as a rapid thermal anneal or laser anneal. Alternatively, the n-well 654 may be formed by another suitable process, such as a diffusion process. The n-well 654 extends downwardly from the top surface of the semiconductor substrate 651, is adjacent to the n-type doped region 662, and a portion of the n-well 654 is below the FOX 610. In some embodiments, a difference between a concentration of the p-type dopant in the n-well 654 and a concentration of the n-type dopant in the n-type doped region 662 may be less than three orders of magnitude. In other words, the concentration of the p-type dopant in the n-well 654 is greater than the concentration of the n-type dopant in the n-type doped region 662 and lower than about one thousand times the concentration of the n-type dopant in the n-type doped region 662. In some embodiments, the difference between the concentration of the p-type dopant in the n-well 654 and the concentration of the p-type dopant in the n-type doped region 662 may be less than two orders of magnitude. In other words, the concentration of the p-type dopant in the n-well 654 is greater than the concentration of the n-type dopant in the n-type doped region 662 and lower than about one hundred times the concentration of the n-type dopant in the n-type doped region 662.

At block S26, a gate structure 647 is formed on the semiconductor substrate 651. The gate structure 647 includes a gate dielectric 640 formed on the semiconductor substrate 651, and a gate electrode 645 formed on the gate dielectric 640. The gate dielectric 640 has a first portion overlying the n-type doped region 662 and a second portion overlying the n-well 654. In some embodiments, the n-type dopant of the n-type doped region 662 may diffuse into the gate dielectric 640.

At block S27, a drain 628 may be formed in the DPW 652 and a source is formed in an upper portion of the n-well 654. The source has two oppositely doped regions 624 and 626, both formed in the upper portion of the n-well 654. The source's first region 624 and drain 628 may have the first type of conductivity, and the source's second region 626 may have the second type of conductivity. By way of example and not limitation, the source's first region 624 and drain 628 include p-type dopants, such as boron (B), and the source's second region 626 includes n-type dopants, such as phosphorum (P) or arsenic (As). Alternatively, the source could have one type of conductivity. The source and drain may be positioned on both sides of the gate structure 647. In some embodiments, a dopant concentration of p-type in the first region 624 of the source is greater than a dopant concentration of n-type in the n-type doped region 662. In greater detail, a difference between a concentration of the p-type dopant in the first region 624 of the source and a concentration of the n-type dopant in the n-type doped region 662 may be less than five, four, or three orders of magnitude. In some embodiments, a dopant concentration of n-type in the second region 626 of the source is greater than a dopant concentration of n-type in the n-type doped region 662. In greater detail, a difference between a concentration of the n-type dopant in the second region 626 of the source and a concentration of the n-type dopant in the n-type doped region 662 may be less than five, four, or three orders of magnitude. In some embodiments, a dopant concentration of p-type in the drain 628 is greater than a dopant concentration of n-type in the n-type doped region 662. In greater detail, a difference between a concentration of the p-type dopant in the drain 628 and a concentration of the n-type dopant in the n-type doped region 662 may be less than five, four, or three orders of magnitude.

At block S28, contacts 616, 614, and 618 are formed in the interlayer dielectric (ILD) layer 696 to contact the gate structure 647, the drain 628, and the regions 624 and 626 of the source. For example, openings are formed in the ILD layer 196, and conductive materials are then deposited in the openings. The excess portions of the conductive materials outside the openings are removed by using a CMP process, while leaving portions in the openings to serve as the contacts 616, 614, and 618. In some embodiments, the contacts 616, 614, and 618 may be made of tungsten, aluminum, copper, or other suitable materials. In FIG. 16, the contact 616 is electrically connected to the gate structure 647, the contact 614 is connected to the drain 628, and the contact 618 is connected to the regions 624 and 626 of the source.

According to the aforementioned embodiments, it can be seen that the present disclosure offers advantages in fabricating semiconductor devices. It is understood, however, that other embodiments may offer additional advantages, and not all advantages are necessarily disclosed herein. A breakdown voltage of the LDMOS transistor is limited by an electric field peak which may take place in the vicinity of a bird's beak of the FOX, and the electric field peak may lead to a device breakdown failure. By way of example, the device breakdown failure may occur when a deep n-well (DNW) has not been fully depleted through a p-type semiconductor substrate since a dopant concentration of n-type is higher than a dopant concentration of p-type near the bird's beak of the FOX, which in turn adversely affects the electric field. When the dopant concentration of n-type in DNW is lowered to reach a charge balance near the bird's beak, the peak electric field may be improved. However, it will cause breakdown in the drift region and reduce the breakdown voltage of the LDMOS transistor.

Hence, an advantage is that a p-type dopant is implant into a p-type doped region (i.e., the vicinity of the bird's beak of the FOX near the source region as shown in FIG. 5) in the deep n-well, such that a dopant concentration of p-type near the source region is increased, and thus a charge balance is reached. Therefore, the electric field peak may be reduced, thereby achieving an improved breakdown voltage for the LDMOS transistor.

In some embodiments, a method for manufacturing a semiconductor device includes forming a first-type deep well with a first impurity of a first conductivity type in a semiconductor substrate; doping a second impurity of a second conductivity type into the first-type deep well to form a second-type doped region, in which a concentration of the first impurity in the first-type deep well is greater than a concentration of the second impurity in the second-type doped region and less than about ten times the concentration of the second impurity in the second-type doped region; forming a field oxide partially embedded in the semiconductor substrate, the field oxide laterally extending from a first side of the second-type doped region; forming a second-type well of the second conductivity type in the first-type deep well and on a second side of the second-type doped region opposite the first side of the second-type doped region; forming a gate structure laterally extending past the first and second sides of the second-type doped region; forming a source region in the second-type well and a drain region in the first-type deep well, in which the field oxide extends laterally between the second-type doped region and the drain region.

In some embodiments, a method for manufacturing a semiconductor device includes forming a deep n-well in a semiconductor substrate; forming a patterned mask layer over the deep n-well; with the patterned mask layer in place, doping a p-type dopant into the deep n-well to form a p-type doped region; annealing the semiconductor substrate to deepen the deep n-well and the p-type doped region; after annealing the semiconductor substrate, oxidizing a part of the deep n-well and a part of the p-type doped region to form a field oxide; forming a p-well in the deep n-well, in which the p-type doped region is laterally between the p-well and the field oxide; forming a gate structure extending from the p-well to the field oxide across the p-type doped region; forming a source region in the p-well and a drain region in the deep n-well.

In some embodiments, a semiconductor device includes a semiconductor substrate, a deep n-well, a field oxide, a gate structure, a p-type doped region, a source region, and a drain region. The deep n-well is in a semiconductor substrate. The field oxide is partially embedded in the deep n-well and has a tip corner in a position substantially level with a top surface of the semiconductor substrate. The gate structure is on the field oxide and laterally extends past the tip corner of the field oxide. The p-type doped region is in the deep n-well and is interfaced with the tip corner of the field oxide. The source region and the drain region are laterally separated at least in part by the p-type doped region and the field oxide.

In some embodiments, a semiconductor device includes a deep n-well, a field oxide, a gate structure, a p-type doped region, a source region, and a drain region. The deep n-well is in the semiconductor substrate. The field oxide is partially embedded in the deep n-well and having a tip corner in a position substantially level with a top surface of the semiconductor substrate. The gate structure is on the field oxide and laterally extends past the tip corner of the field oxide. The p-type doped region is in the deep n-well and is interfaced with the tip corner of the field oxide. The source region and a drain region are laterally separated at least in part by the p-type doped region and the field oxide. In some embodiments, the p-type doped region comprises boron as a p-type dopant. In some embodiments, a concentration of a p-type dopant in the p-type doped region is greater than about $1.0 \times 10^{12}$ atoms/centimeter$^3$. In some embodiments, a concentration of an n-type dopant in the deep n-well is greater than a concentration of a p-type dopant in the p-type doped region. In some embodiments, a concentration of a dopant in the source region is greater than a concentration of a p-type dopant in the p-type doped region. In some embodiments, a concentration of a dopant in the drain region is greater than a concentration of a p-type dopant in the p-type doped region. In some embodiments, the semiconductor device further includes a p-well in the deep n-well and on a side of the p-type doped region opposite to of the field oxide, wherein a concentration of a first p-type dopant in the p-well is greater than a concentration of a second p-type dopant in the p-type doped region. In some embodiments, the semiconductor device further includes a buried p-well region below the field oxide, wherein a concentration of a first p-type dopant in the buried p-well region is greater than a concentration of a second p-type dopant in the p-type doped region. In some embodiments, the deep n-well has a lower bottom directly below the source region than directly below the p-type doped region. In some embodiments, the deep n-well has a lower bottom directly below the field oxide than directly below the p-type doped region.

In some embodiments, a semiconductor device includes a semiconductor device includes a substrate, a deep well, a doped region, a field oxide, a well, a gate structure, a source region, and a drain region. The deep well is with a first impurity of a first conductivity type in the substrate. The doped region is with a second impurity of a second conductivity type in the deep well. The field oxide is partially embedded in the deep well and is partially embedded in the doped region. The well of the second conductivity type is in the deep well and on a side of the doped region opposite to of the field oxide. The gate structure is on the field oxide and laterally extends past opposite sides of the doped region. The source region is in the well. The drain region is in the deep well and is laterally spaced apart from the doped region by the field oxide. In some embodiments, a bottommost position of the doped region is higher than a bottom surface of the field oxide. In some embodiments, a bottommost position of the doped region is higher than a bottommost position of the well. In some embodiments, a bottommost position of the doped region is lower than a bottommost position of the well. In some embodiments, the deep well has a lower bottom directly below the field oxide than directly below the doped region.

In some embodiments, a semiconductor device includes a semiconductor device includes a substrate, a deep n-well, a boron-doped region, a field oxide, a p-well, a gate structure, a source region, and a drain region. The deep n-well is in a substrate. The boron-doped region is in the deep n-well. The field oxide partially is embedded in the substrate and laterally extending from the boron-doped region. The p-well is in the deep n-well. The boron-doped region is laterally between the p-well and the field oxide. The gate structure laterally extends across the boron-doped region. The source region is in the p-well. The drain region is in the deep n-well. In some embodiments, a gate dielectric of the gate structure comprises boron. In some embodiments, a concentration of an n-type dopant in the deep n-well is greater than a boron concentration of in the boron-doped region. In some embodiments, a bottommost position of the deep n-well directly below the source region is lower than a bottommost position of the deep n-well directly below the boron-doped region. In some embodiments, a bottommost position of the deep n-well directly below the field oxide is lower than a bottommost position of the deep n-well directly below the boron-doped region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a deep well of a first conductivity type in the substrate;
   a doped region in the deep well with an impurity of a second conductivity type;
   a field oxide over the deep well, the field oxide having a side interfaced with the doped region;
   a gate over the field oxide;
   source and drain regions over the substrate and laterally separated at least in part by the doped region and the field oxide; and
   a well in the deep well and at a side of the doped region opposite to the field oxide, wherein the source region is in the well, and a concentration of the impurity in the doped region is lower than a concentration of a dopant in the well.

2. The semiconductor device of claim 1, wherein the field oxide has a tip corner interfaced with the doped region.

3. The semiconductor device of claim 1, wherein a concentration of the impurity in the doped region is higher than about $1.0 \times 10^{12}$ atoms/centimeter$^3$.

4. The semiconductor device of claim 1, wherein the impurity comprises boron.

5. The semiconductor device of claim 1, wherein the deep well is doped with a dopant of the first conductivity type, and a concentration of the impurity in the doped region is lower than a concentration of the dopant in the deep well.

6. The semiconductor device of claim 1, wherein a concentration of the impurity in the doped region is lower than a concentration of a dopant in the drain region.

7. The semiconductor device of claim 1, wherein a concentration of the impurity in the doped region is lower than a concentration of a dopant in the source region.

8. The semiconductor device of claim 1, wherein a bottom of the deep well below the doped region is higher than a bottom of the deep well below the source region.

9. The semiconductor device of claim 1, wherein a bottom of the deep well below the doped region is higher than a bottom of the deep well below the drain region.

10. The semiconductor device of claim 1, wherein a bottommost position of the doped region is higher than a bottommost position of the field oxide.

11. A semiconductor device, comprising:
    a deep well in a substrate;
    a field oxide over the deep well;
    a gate structure over the deep well and the field oxide, wherein a bottom surface of the deep well has a first region overlapping with the gate structure and a second region non-overlapping with the gate structure, wherein the first region of the bottom surface of the deep well is higher than the second region of the bottom surface of the deep well; and
    source and drain regions over the substrate and laterally separated at least in part by the field oxide and the gate structure.

12. The semiconductor device of claim 11, wherein the bottom surface of the deep well has a third region overlapping with the source region and lower than the first region of the bottom surface of the deep well.

13. The semiconductor device of claim 11, further comprising:
    a doped region in the deep well with a first dopant of a first conductivity type, wherein the doped region is between the field oxide and the source region, the doped region is below the gate structure, and the deep well is doped with a second dopant of a second conductivity type opposite to the first conductivity type.

14. The semiconductor device of claim 13, wherein a bottommost position of the doped region is higher than a bottommost position of the field oxide.

15. The semiconductor device of claim 13, wherein a bottommost position of the doped region is lower than a bottommost position of the field oxide.

16. A method, comprising:
    forming a deep well in a substrate, wherein the deep well is of a first conductivity type;
    doping a first dopant into the deep well to form a doped region, wherein the first dopant is of a second conductivity type;
    forming a field oxide over the deep well and the doped region;
    forming a well in the deep well, wherein the well is of the second conductivity type, and the well is spaced apart from the field oxide by the doped region;
    forming a gate structure extending from the well to the field oxide across the doped region;
    forming a source region in the well; and
    forming a drain region in the deep well.

17. The method of claim 16, wherein the first dopant comprises boron.

18. The method of claim 16, wherein a concentration of the first dopant in the doped region is greater than about $1.0 \times 10^{12}$ atoms/centimeter$^3$.

19. The method of claim 16, wherein a concentration of the first dopant in the doped region is lower than a concentration of a second dopant in the well.

20. The method of claim 16, wherein a concentration of the first dopant in the doped region is lower than a concentration of a second dopant in the drain region.

* * * * *